(12) United States Patent
Imai

(10) Patent No.: US 8,203,143 B2
(45) Date of Patent: Jun. 19, 2012

(54) THIN FILM FIELD EFFECT TRANSISTOR

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 421 days.

(21) Appl. No.: 12/538,891

(22) Filed: Aug. 11, 2009

(65) Prior Publication Data

US 2010/0038641 A1    Feb. 18, 2010

(30) Foreign Application Priority Data

Aug. 14, 2008 (JP) .................................. 2008-208978
Jul. 6, 2009 (JP) .................................. 2009-159841

(51) Int. Cl.
*H01L 29/12* (2006.01)

(52) U.S. Cl. ..................... 257/43; 257/57; 257/E29.296

(58) Field of Classification Search ................... 257/43, 257/57, 59, E29.296
See application file for complete search history.

(56) References Cited

U.S. PATENT DOCUMENTS 7,626,201 B2 * 12/2009 Chiang et al. .................... 257/59
2009/0189153 A1 * 7/2009 Iwasaki et al. .................. 257/43
2009/0321731 A1 * 12/2009 Jeong et al. ..................... 257/43

FOREIGN PATENT DOCUMENTS

| JP | 2006-165529 A | 6/2006 |
| JP | 2007-073701 A | 3/2007 |
| JP | 2007-123702 A | 5/2007 |
| JP | 2008-042088 A | 2/2008 |

OTHER PUBLICATIONS

Yutaka Sawada, "Tertiary Compound and Multicomponent (composite) Oxide", Development of Transparent Conductive Films II, Oct. 31, 2002, pp. 34-35, CMC Publishing Co., Ltd. Tokyo, Japan.
B. Yaglioglu et al, "High-mobility amorphous In2O3-10 wt %ZnO thin film transistors", Applied Physics Letters 89. 062103(2006), American Institute of Physics (http://dx.doi.org/10.1063/1.2335372).

* cited by examiner

*Primary Examiner* — Evan Pert
*Assistant Examiner* — Scott Stowe
(74) *Attorney, Agent, or Firm* — Solaris Intellectual Property Group, PLLC

(57) ABSTRACT

A thin film field effect transistor has at least a gate electrode 2, a gate insulating layer 3, an active layer 4, a source electrode 5-1 and a drain electrode 5-2 on a substrate 1. The active layer includes an amorphous oxide semiconductor including at least In and Zn, a first interface layer 61 is disposed between the gate insulating layer and the active layer such that it is adjacent to at least the active layer, and a second interface layer is disposed on the opposite side of the active layer with respect to the first interface layer such that it is adjacent to the active layer. A content of Ga or Al in the amorphous oxide semiconductor of each of the first interface layer and the second interface layer is higher than a content of Ga or Al in the amorphous oxide semiconductor of the active layer.

12 Claims, 15 Drawing Sheets

THIN FILM FIELD EFFECT TRANSISTOR

CROSS-REFERENCE TO RELATED APPLICATION

This application claims priority under 35 USC 119 from Japanese Patent Application Nos. 2008-208978 filed on Aug. 14, 2008 and 2009-159841 filed on Jul. 6, 2009, the disclosures of which are incorporated by reference herein.

BACKGROUND OF THE INVENTION

1. Field of the Invention

The present invention relates to a thin film field effect transistor in which an amorphous oxide semiconductor is used for an active layer.

2. Description of the Related Art

In recent years, flat panel displays (FPDs) have been put to practical use, due to the progress made in liquid crystal and electroluminescence (EL) technologies, etc. Especially, an organic electroluminescence element (hereinafter referred to as "organic EL element" in some cases) formed using a thin film material which emits light by excitation due to application of electric current can provide light emission of high brightness at low voltage, and thus is expected to achieve reduction in device thickness, weight, and size, and power saving, etc. in wide ranging applications including mobile phone displays, personal digital assistants (PDA), computer displays, car information displays, TV monitors, and general illumination.

These FPDs are driven by an active matrix circuit including thin film field effect transistors ("thin film transistor", hereinafter also referred to as "TFT") each using, as an active layer, an amorphous silicon thin film or a polycrystalline silicon thin film provided on a glass substrate.

On the other hand, to make the FPD thinner, lighter, and more resistant to breakage, attempts are being made to use a resin substrate which is light in weight and flexible instead of the glass substrate.

However, fabrication of the transistors using the silicon thin films described above requires a thermal treatment process at a relatively high temperature, and it is difficult to form the transistors directly on a resin substrate which is generally low in heat resistance.

Hence, such TFTs have been actively developed using, as a semiconductor thin film, a film of an amorphous oxide, such as an In—Ga—Zn—O-based amorphous oxide, which can be formed at low temperatures. As the TFT which employs an amorphous oxide semiconductor can be formed at room temperature, the TFT can be fabricated on a film. Therefore, amorphous oxide semiconductors have been attracting attention as a material for active layers of TFTs for a film (flexible substrate) lately.

For example, Japanese Patent Application Laid-Open (JP-A) No. 2007-73701 discloses a TFT having an electric insulating layer as a resistance layer, which contains an amorphous oxide and has an electric resistance of $10^{11}$ Ωcm or more, between an active layer and a gate insulating layer. JP-A No. 2007-73701 discloses that the resistance layer has an effect of decreasing an OFF current and a gate leak current. In view of revealing the effect, a thickness of the resistance layer is described to be preferably from 1 nm to 200 nm.

JP-A No. 2008-42088 discloses a thin film device provided with a laminated structure having a first insulator, an active layer containing an oxide semiconductor, and a second insulator in this order, and also having a first interface layer located at the interface of the active layer with the first insulator and a second interface layer located at the interface of the active layer with the second insulator, in which oxygen vacancy densities of the first interface layer and the second interface layer are lower than the oxygen vacancy density of a bulk of the active layer. Considering that the structure is achieved by subjecting the active layer, the first insulator, and the second insulator to oxidation treatment without being exposed to the air during the formation thereof, the metal compositions of the first interface layer and the second interface layer are the same as that of the active layer, and there is a difference only in the oxygen vacancy density. It is disclosed that, by controlling an oxygen vacancy density of the interfaces, an ON/OFF ratio of a drain current is improved.

JP-A No. 2007-123702 discloses a TFT in which an oxide semiconductor layer of such as $In_2O_3$ and an intermediate oxide layer containing $Ga_2O_3$ are laminated to form an active layer. In the structure, the intermediate oxide layer is so thin that a tunnel effect is revealed and is laminated with the oxide semiconductor layer. A TFT employing a plurality of these laminated structures as the active layer is disclosed. It is disclosed that, by providing the intermediate oxide layer, oxygen defects of the oxide semiconductor are prevented.

SUMMARY OF THE INVENTION

The present invention has been made in view of the above circumstances and provides the following TFT.

An aspect of the present invention provides a thin film field effect transistor including: at least a gate electrode, a gate insulating layer, an active layer, a source electrode and a drain electrode on a substrate, wherein the active layer comprises an amorphous oxide semiconductor containing at least In and Zn;

a first interface layer comprising an amorphous oxide semiconductor containing Ga or Al is disposed between the gate insulating layer and the active layer such that it is adjacent to at least the active layer, a content of Ga or Al in the amorphous oxide semiconductor of the first interface layer being higher than a content of Ga or Al in the amorphous oxide semiconductor of the active layer; and a second interface layer comprising an amorphous oxide semiconductor containing Ga or Al is disposed on the opposite side of the active layer with respect to the first interface layer such that it is adjacent to the active layer, a content of Ga or Al in the amorphous oxide semiconductor of the second interface layer being higher than the content of Ga or Al in the amorphous oxide semiconductor of the active layer.

DETAILED DESCRIPTION OF THE INVENTION

Figure 1:
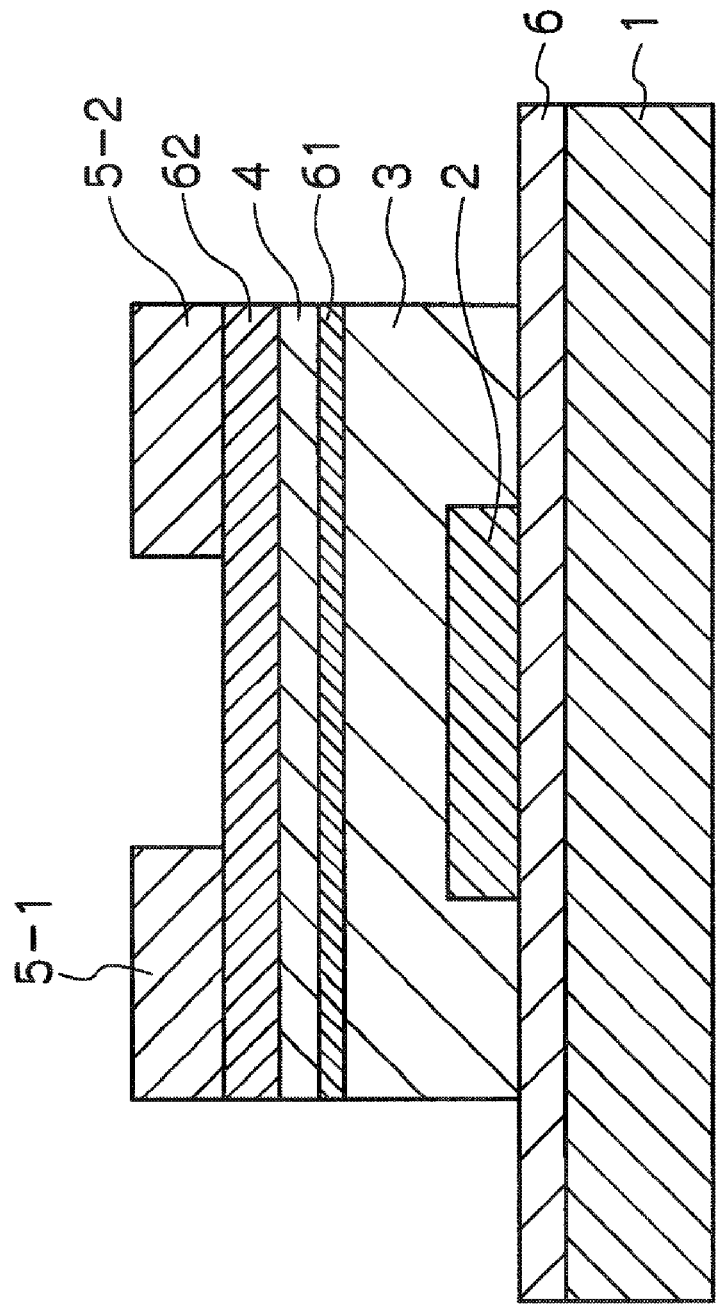
FIG. 1 is a schematic diagram showing a structure of an inverted-staggered TFT element according to the invention.

The invention provides a thin film field effect transistor including at least a gate electrode, a gate insulating layer, an active layer, a source electrode and a drain electrode on a substrate and having the following characteristics 1) to 3):
1) the active layer comprises an amorphous oxide semiconductor containing at least In and Zn;
2) a first interface layer including an amorphous oxide semiconductor containing Ga or Al is disposed between the gate insulating layer and the active layer such that it is adjacent to at least the active layer, a content (proportion) of Ga or Al in the amorphous oxide semiconductor of the first interface layer being higher than a content of Ga or Al in the amorphous oxide semiconductor of the active layer; and
3) a second interface layer including an amorphous oxide semiconductor containing Ga or Al is disposed on the opposite side of the active layer with respect to the first interface layer such that it is adjacent to the active layer, a content of Ga or Al in the amorphous oxide semiconductor of the second interface layer being higher than the content of Ga or Al in the amorphous oxide semiconductor of the active layer.

Preferably, the amorphous oxide semiconductor of the active layer contains In at a content of 70% or more and Zn at a content of 5% or more with respect to all metal components in the amorphous oxide semiconductor of the active layer.

Preferably, the content of Ga or Al in the amorphous oxide semiconductor of the first interface layer is at least twice the content of Ga or Al in the amorphous oxide semiconductor of the active layer, and the content of Ga or Al in the amorphous oxide semiconductor of the second interface layer is at least twice the content of Ga or Al in the amorphous oxide semiconductor of the active layer.

Particularly preferably, the amorphous oxide semiconductor of the active layer contains In at a content of 70% or more and Zn at a content of 5% or more with respect to all the metal components in the amorphous oxide semiconductor of the active layer, the content of Ga or Al in the amorphous oxide semiconductor of the first interface layer is at least twice the content of Ga or Al in the amorphous oxide semiconductor of the active layer, and the content of Ga or Al in the amorphous oxide semiconductor of the second interface layer is at least twice the content of Ga or Al in the amorphous oxide semiconductor of the active layer.

Preferably, a thickness of the active layer is 1.0 nm or more and less than 20 nm. More preferably, the thickness of the active layer is 2.5 nm or more and less than 15 nm. Another more preferable thickness of the active layer is 1.0 nm or more and less than 2.0 nm.

Preferably, plural active layers are provided, and an intermediate interface layer is disposed between the active layers which are adjacent to each other and includes an amorphous oxide semiconductor containing Ga or Al, the content of Ga or Al in the amorphous oxide semiconductor of the intermediate interface layer being higher than the content of Ga or Al in the amorphous oxide semiconductor of the active layers.

Preferably, a thickness of the first interface layer is 0.3 nm or more and less than 1.0 nm.

Preferably, a thickness of the second interface layer is from 10 nm to 200 nm.

Particularly preferably, the thickness of the active layer is 1.0 nm or more and less than 20 nm, the thickness of the first interface layer is 0.3 nm or more and less than 1.0 nm, and the thickness of the second interface layer is from 10 nm to 200 nm.

Preferably, oxygen vacancy densities of the active layer and the first interface layer are substantially the same.

Preferably, oxygen vacancy densities of the active layer and the second interface layer are substantially the same.

Preferably, a specific resistance of the first interface layer is less than $10^{10}$ Ωcm.

JP-A No. 2007-73701 discloses a structure in which a resistance layer is provided between an active layer and a gate insulating layer. The resistance layer has a high electric resistance value, in which a specific electric resistance of the resistance layer is $10^{11}$ Ωcm or more, as compared with a specific electric resistance of the active layer of less than $10^{10}$ Ωcm. Further, a film thickness of the resistance layer is from 1 nm to 200 nm. With the structure, the active layer and the resistance layer form a channel together. However, in the structure, the resistance layer that has a high electric resistance value exists at an interface of the gate insulating layer, and serves as a carrier transporting path. Thus, the electric field effect mobility decreases, and the threshold shift during prolonged driving becomes large.

JP-A No. 2008-42088 discloses a structure in which a first interface layer and a second interface layer are disposed on both sides of the active layer. Metal compositions of the first interface layer and the second interface layer are the same as the metal composition of the active layer, and there is a difference only in an oxygen vacancy density. The first interface layer and the second interface layer have a lower oxygen vacancy density and a higher electric resistance value than the active layer. With the structure, fluctuation of the oxygen vacancy density of the active layer with aging cannot be suppressed.

JP-A No. 2007-123702 neither discloses nor suggests the structure and the effects of the invention.

JP-A Nos. 2007-73701, 2008-42088, and 2007-123702 neither disclose nor suggest durability of TFT against heat, oxygen, ultraviolet rays, or the like.

The invention provides a TFT that employs an amorphous oxide semiconductor for an active layer, and is excellent in drive durability and drive stability. In particular, the invention provides a TFT which has excellent drive durability and drive stability by suppressing a variation of a threshold voltage during continuous driving, and shifting a voltage threshold which has been distorted toward the negative side to the positive side. Further, the invention provides a TFT that has a higher durability against heat, oxygen, ultraviolet rays, or the like in a process after production of the TFT, and is stable in electrical characteristics of the TFT without changing even aging or heating of the TFT, and a TFT in which a malfunction due to light of short wavelength such as blue light, X-rays or the like, is retarded.

1. TFT

The TFT of the invention is an active element which includes at least a gate electrode, a gate insulating layer, an active layer, a source electrode, and a drain electrode in this order, and has a function of controlling the electric current that passes through the active layer when a voltage is applied to the gate electrode, and switching an electric current between the source electrode and the drain electrode. As a TFT structure, either of a staggered structure or an inverted-staggered structure may be formed.

The TFT of the invention includes, on a substrate, at least a gate electrode, a gate insulating layer, an active layer, a source electrode and a drain electrode, wherein the active layer comprises an amorphous oxide semiconductor containing at least In and Zn, a first interface layer comprising an amorphous oxide semiconductor containing Ga or Al is disposed between the gate insulating layer and the active layer such that it is adjacent to at least the active layer, the content of Ga or Al in the amorphous oxide semiconductor of the first interface layer being higher than the content of Ga or Al in the amorphous oxide semiconductor of the active layer, and a second interface layer comprising an amorphous oxide semiconductor containing Ga or Al is disposed such that it is adjacent to the active layer on the opposite side of the active layer with respect to the first interface layer, the content of Ga or Al in the amorphous oxide semiconductor of the second interface layer being higher than the content of Ga or Al in the amorphous oxide semiconductor of the active layer.

Figure 2:
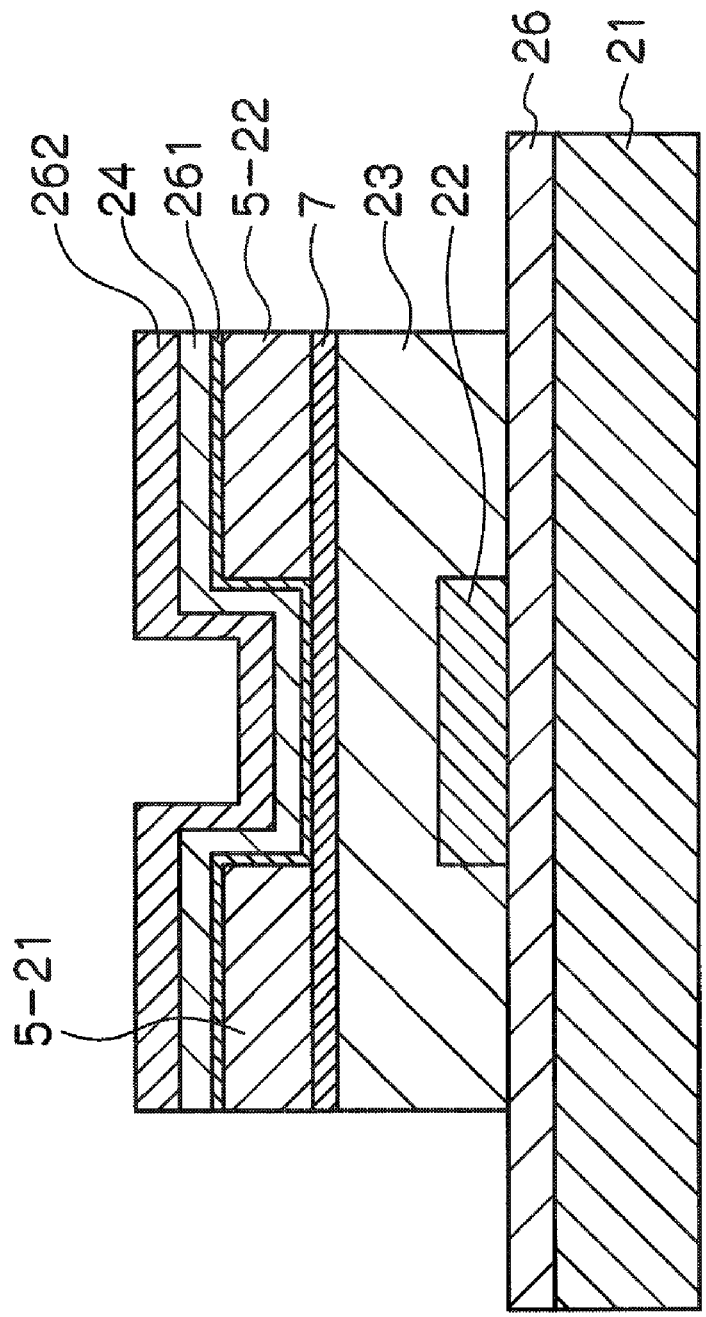
FIG. 2 is a schematic diagram showing a structure of an inverted-staggered TFT element according to another embodiment of the invention.

Conventionally, a top gate structure (a staggered structure) and a bottom gate structure (an inverted-staggered structure) have been known as structures of TFT in accordance with the relation of placement of a source electrode, a drain electrode and a gate electrode. Further, a top contact structure and a bottom contact structure have also been known as structures of TFT in accordance with the relation of placement of a source electrode, a drain electrode and an active layer. Any embodiment of these structures may be applied in a TFT of the present invention. For example, structures shown in FIG. 1 and FIG. 2 each belong to a staggered structure. A structure shown in FIG. 1 is a top contact structure, in which an active layer 4 is formed before a source electrode 5-1 and drain electrode 5-2 are formed. A structure shown in FIG. 2 is a bottom contact structure, in which a source electrode 5-21 and drain electrode 5-22 are formed before an active layer 24 is formed.

In a point of view of attaining high electric field effect mobility as an active layer, the amorphous oxide semiconductor of the active layer preferably contains In at a content of 70% or more and Zn at a content of 5% or more with respect to all the metal components in the amorphous oxide semiconductor of the active layer. More preferably, the content of In is 75% or more and the content of Zn is 5% or more, and still more preferably the content of In is 80% or more and the content of Zn is 5% or more. The definition with respect to the contents of In and Zn in the present invention is based on an atomic %.

In a point of view of interface layers each revealing their functions as described later, the content of Ga or Al in the amorphous oxide semiconductor of the first interface layer is preferably at least twice the content of Ga or Al in the amorphous oxide semiconductor of the active layer, and the content of Ga or Al in the amorphous oxide semiconductor of the second interface layer is preferably at least twice the content of Ga or Al in the amorphous oxide semiconductor of the active layer. More preferably, the content of Ga or Al in the amorphous oxide semiconductor of the first interface layer is at least three times the content of Ga or Al in the amorphous oxide semiconductor of the active layer, and still more preferably at least five times. More preferably, the content of Ga or Al in the amorphous oxide semiconductor of the second interface layer is at least three times the content of Ga or Al in the amorphous oxide semiconductor of the active layer, even more preferably at least five times, and still more preferably at least ten times.

In a point of view of attaining a high electric field effect mobility, a thickness of the active layer is preferably 1.0 nm or more and less than 20 nm, more preferably from 2.5 nm to 15 nm, and still more preferably from 5 nm to 10 nm.

The thickness of the active layer can be suitably set according to the process after formation of TFT or the characteristics and the like required for the device to be produced. The inventor of the present invention had performed the following experiments in order to examine relationships between the thickness of the active layer in the TFT of the invention and TFT characteristics.

Figure 5:
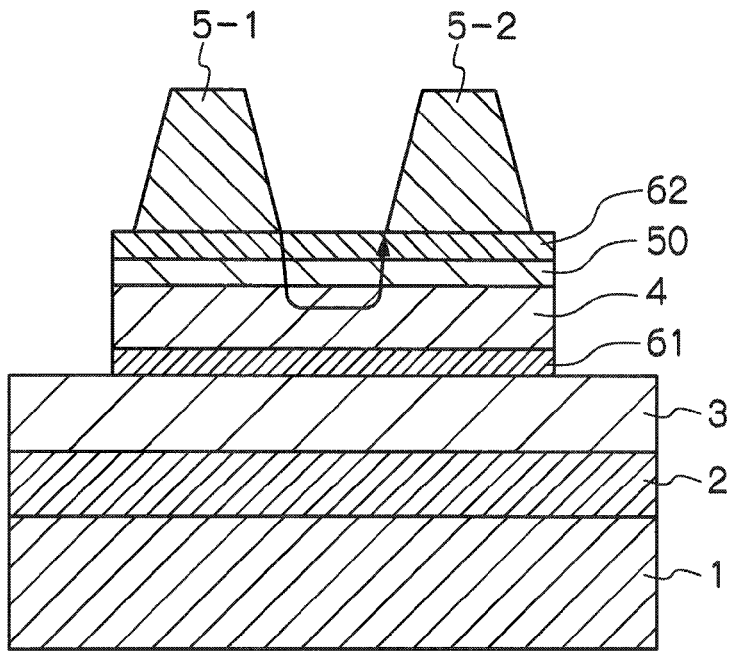
FIG. 5 is a schematic diagram showing a structure of an inverted-staggered TFT element according to the invention.

FIG. 5 is a schematic view illustrating the structure of a TFT of the invention used in the experiments. On a gate insulating layer 3 (material: amorphous $SiO_2$), an amorphous $InGaZnO_4$ (hereinafter also referred to as "IGZO") layer (thickness: 2 nm) which corresponds to a first interface layer 61, an amorphous indium-zinc oxide (hereinafter also referred to as "IZO") layer which corresponds to an active layer 4, and an amorphous $Ga_2O_3$ (hereinafter also referred to as "GaO") layer (thickness: 10 nm) which corresponds to a second interface layer 62 are formed in layers. In addition, between the active layer 4 and the second interface layer 62, a buffer layer 50 (amorphous IGZO+GaO, thickness: 10 nm) in which the composition thereof changes gradually from a composition similar to that of the active layer 4 to a composition similar to that of the second interface layer 62 is provided in order to reduce damage at the time of film formation. In the TFT of the invention, the buffer layer having the composition as described above may be provided between the active layer and the first interface layer or the second interface layer. Such a buffer layer 50 that is present at the interface of the active layer 4 and has the composition may be regarded as a portion of the interface layer (the first interface layer 61 or the second interface layer 62).

Further, on the second interface layer 62, a source electrode and a drain electrode which are made of an Al layer (thickness: 200 nm) are formed.

<Relationship Between Thickness of Active Layer and Mobility>

TFTs having the above structure, in which a thickness of the active layer 4 is set to 0 nm, 1.25 nm, 2.5 nm or 10 nm, are fabricated, and an electric field effect mobility for each obtained TFT is determined.

Figure 6:
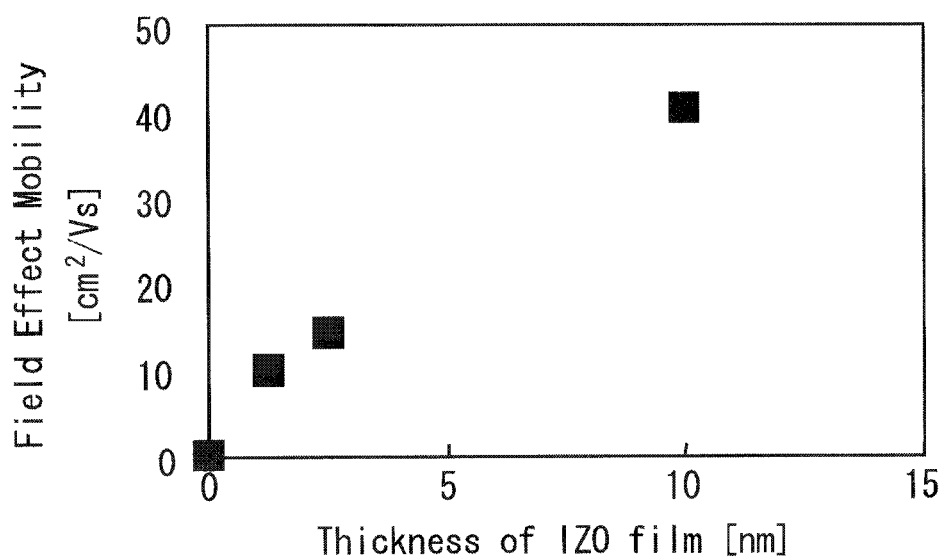
FIG. 6 is a figure showing a relation between a thickness of an active layer and a mobility of a TFT element according to the invention.

FIG. 6 shows a relationship between the thickness of the active layer and the mobility. The thicker the active layer is, the higher the mobility is. But, even when the thickness of the active layer is 1.25 nm, a mobility of 10 cm$^2$/Vs is obtained.

<Change in Threshold Value Due to Stress Driving>

Change in threshold value when driving stress is applied at a constant current (Id=3 μA) is measured.

Figure 7:
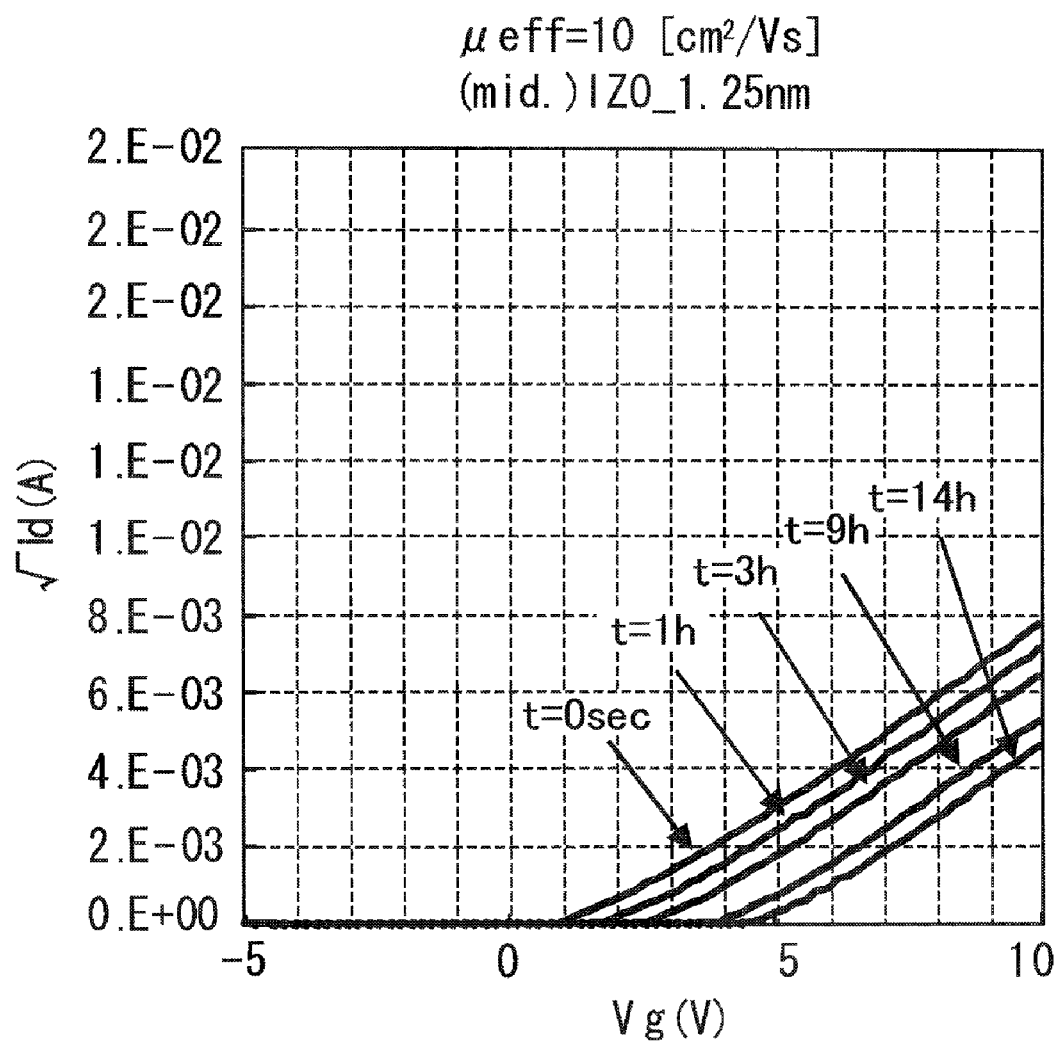
FIG. 7 is a figure showing a variation of Vg-Id curve with a stress time when the thickness of an active layer is 1.25 nm.
Figure 8:
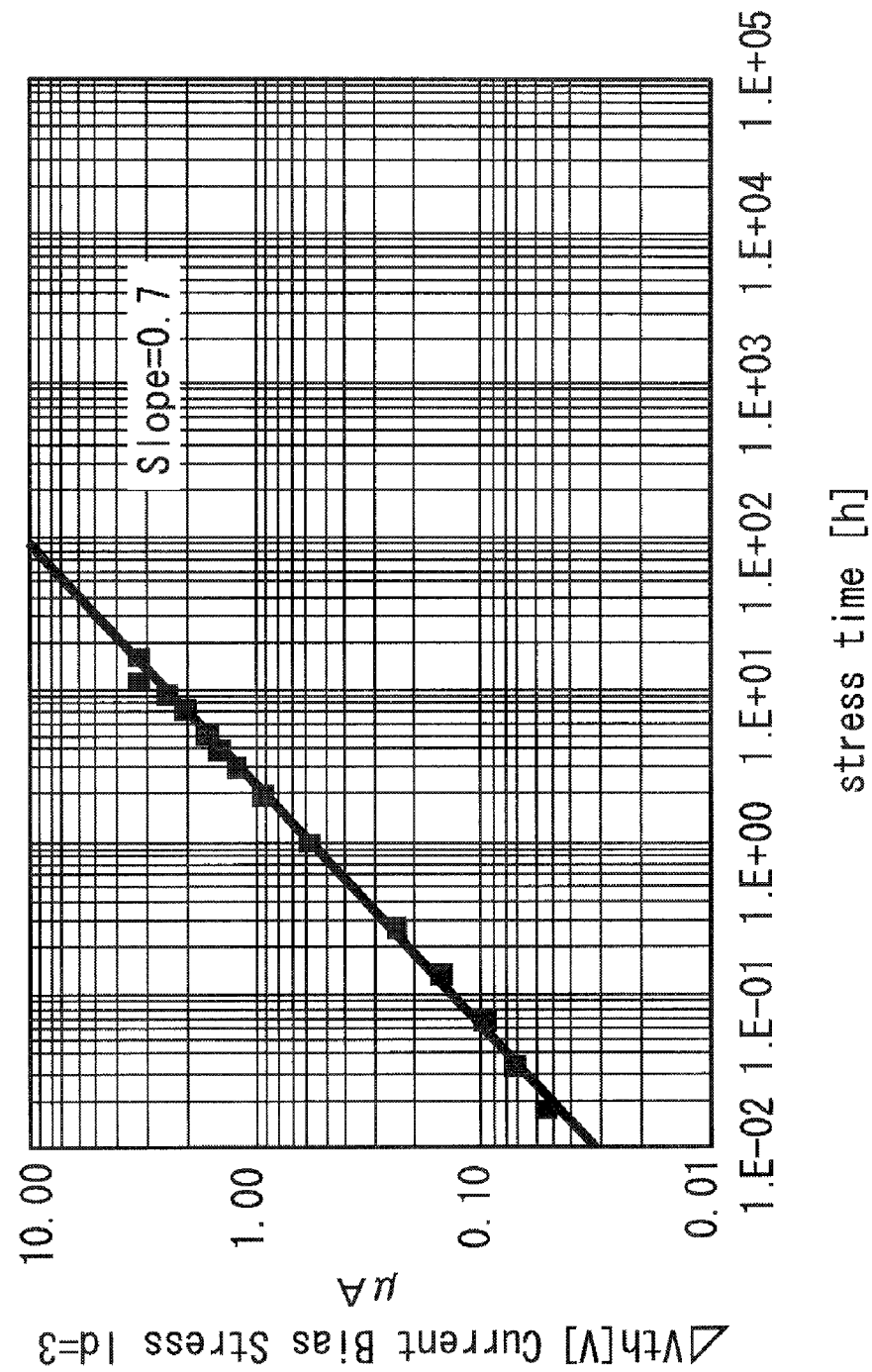
FIG. 8 is a figure showing a threshold value shift (ΔVth) with a stress time when the thickness of an active layer is 1.25 nm.
Figure 9:
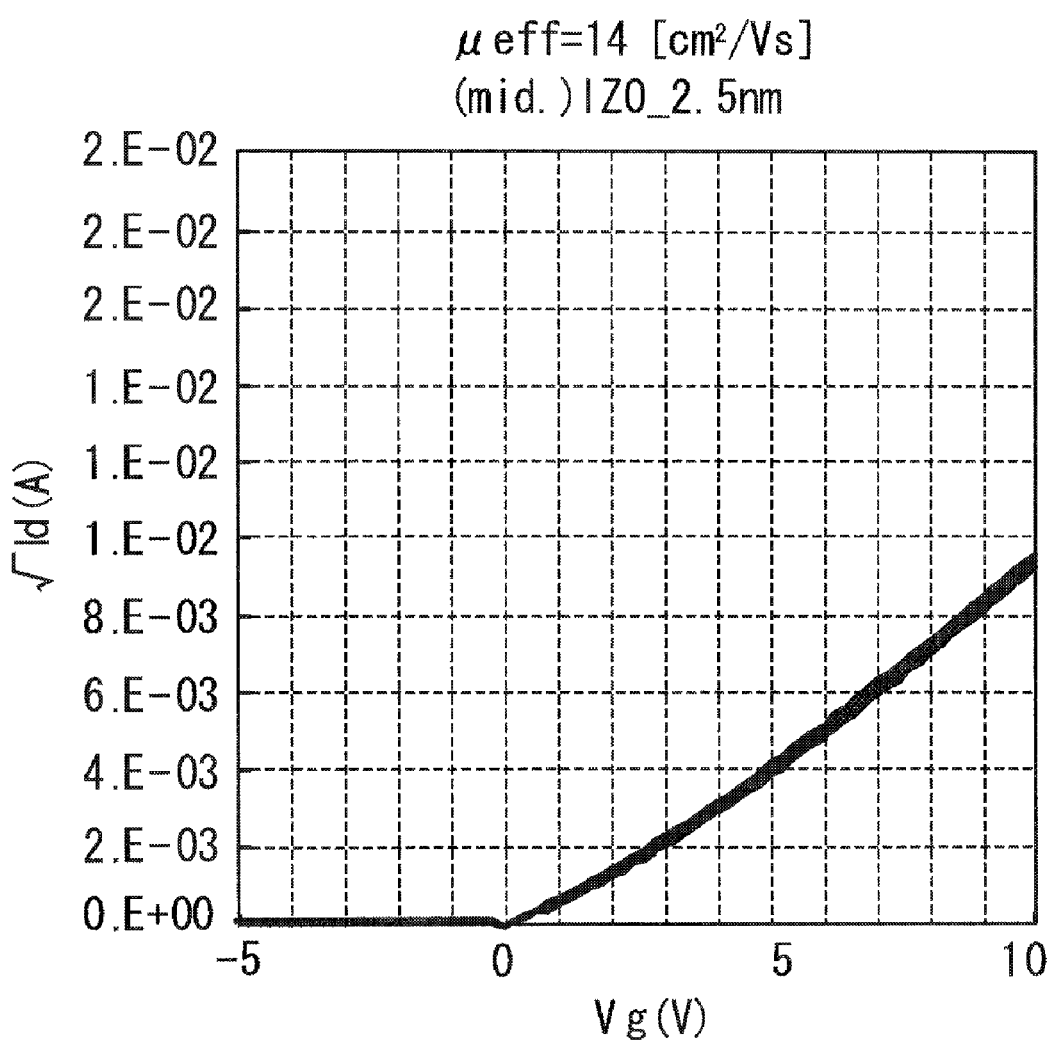
FIG. 9 is a figure showing a variation of Vg-Id curve with a stress time when the thickness of an active layer is 2.5 nm.
Figure 10:
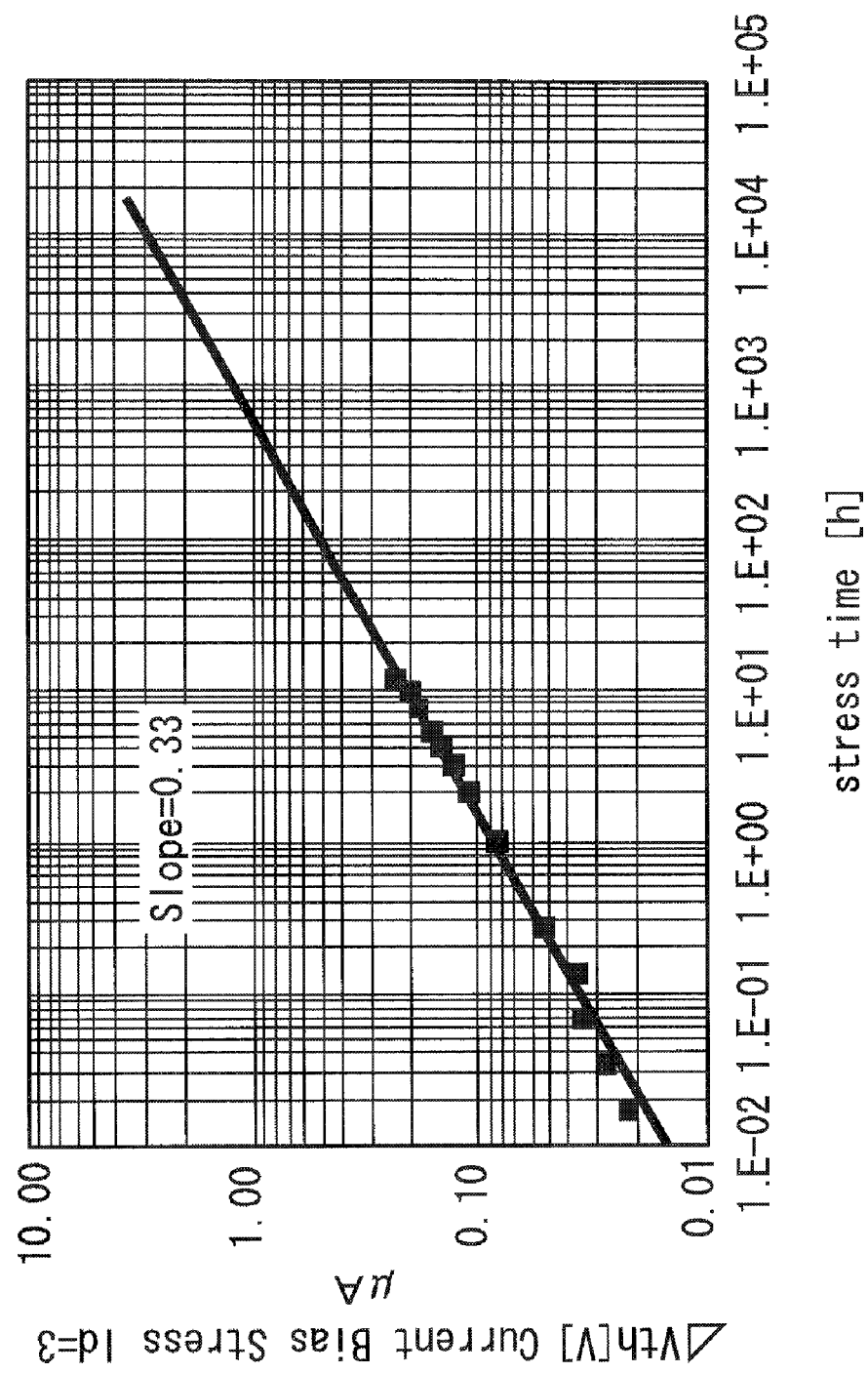
FIG. 10 is a figure showing a threshold value shift (ΔVth) with a stress time when the thickness of an active layer is 2.5 nm.
Figure 11:
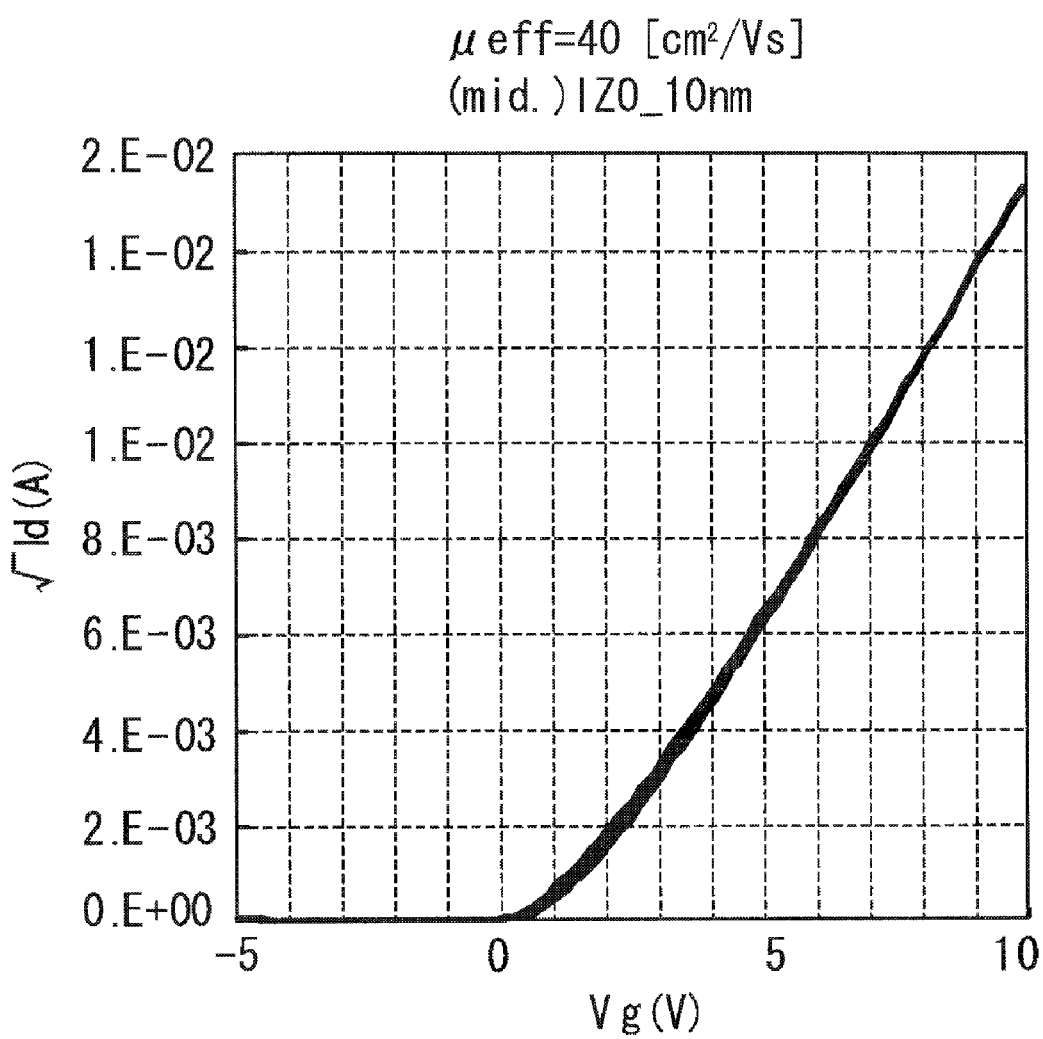
FIG. 11 is a figure showing a variation of Vg-Id curve with a stress time when the thickness of an active layer is 10 nm.
Figure 12:
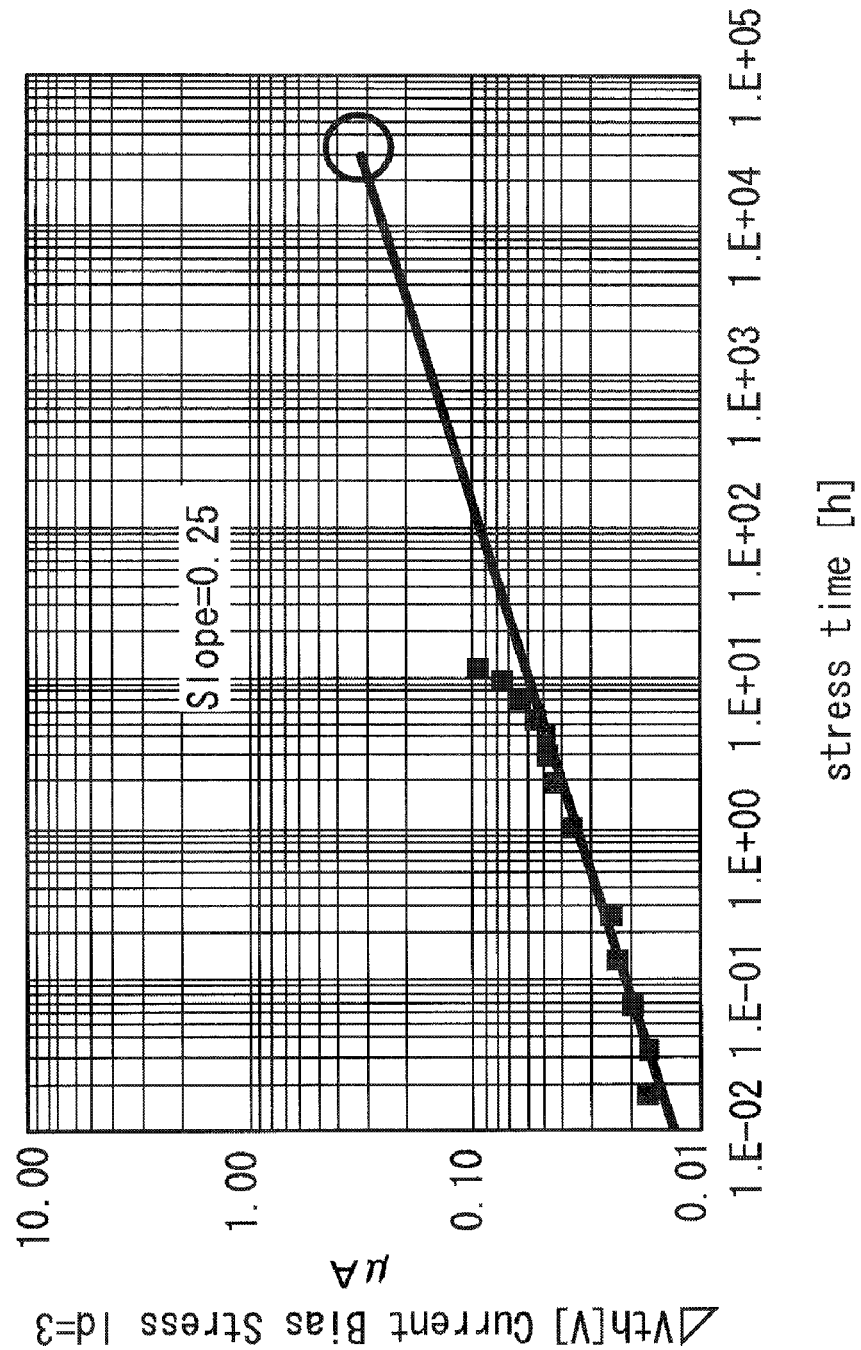
FIG. 12 is a figure showing a threshold value shift (ΔVth) with a stress time when the thickness of an active layer is 10 nm.

When the thickness of the active layer is 1.25 nm, as shown in FIG. 7, change of Vg-Id$^{1/2}$ curve is observed as the stress time becomes longer, and FIG. 8 shows a threshold value shift (ΔVth) with respect to the stress time. Further, FIG. 9 and FIG. 10 each show a relationship between stress time and change in threshold value when the thickness of the active layer is 2.5 nm. FIG. 11 and FIG. 12 each show a relationship between stress time and variation of threshold value when the thickness of the active layer is 10 nm. FIG. 9 and FIG. 11 show a variation of an Id$^{1/2}$ curve depending on the stress times (t=0, 1 h, 3 h, 9 h and 14 h) as in the case of FIG. 7, however the variation is smaller than that in FIG. 7, and five lines almost overlap. Further, a variation in the threshold value shown in FIG. 10 and FIG. 12 is also smaller than that in FIG. 8. From these figures, it is revealed that when driving stress is applied, the larger the thickness of the active layer is, the smaller the threshold value shift is and the higher the drive stability is.

<Change in Threshold Value Due to Thermal Treatment>

Change in threshold value is measured when thermal treatment is applied after production of TFT. Thermal treatment is performed at 120° C., 150° C., or 180° C. for one hour under an atmosphere of oxygen.

Figure 13:
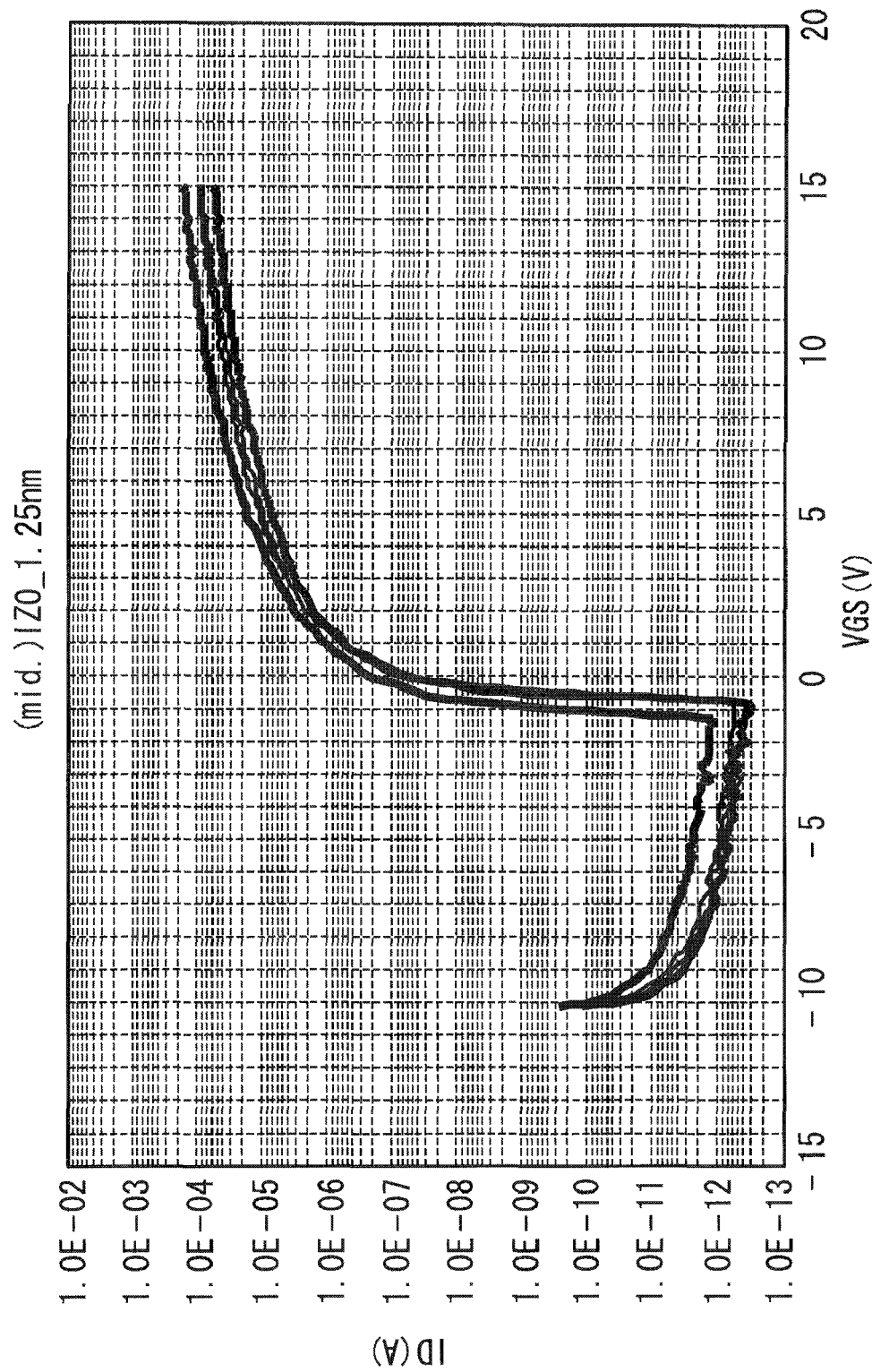
FIG. 13 is a figure showing a variation of a threshold value due to thermal treatment when the thickness of an active layer is 1.25 nm.
Figure 14:
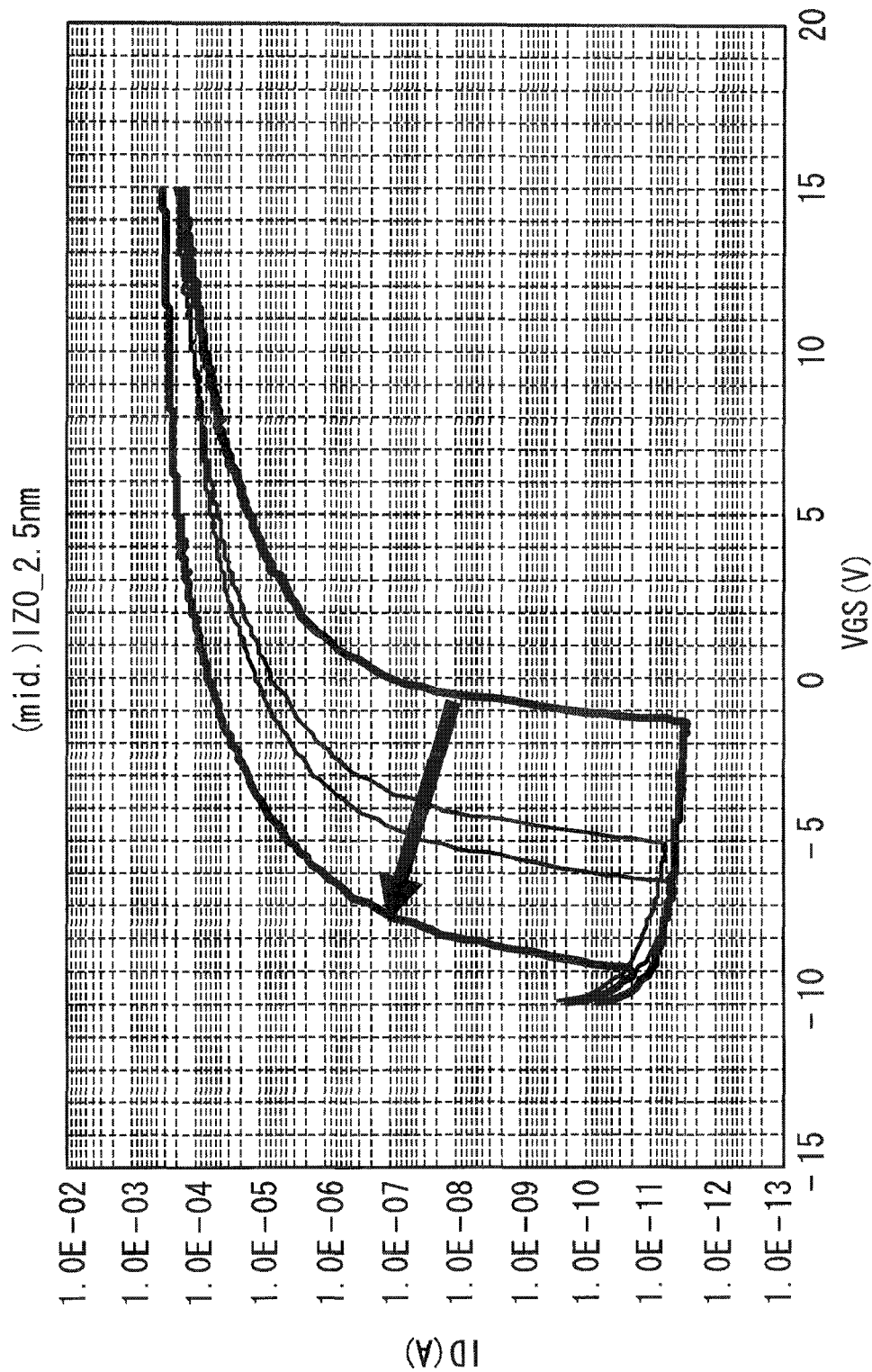
FIG. 14 is a figure showing a variation of a threshold value due to thermal treatment when the thickness of an active layer of 2.5 nm.
Figure 15:
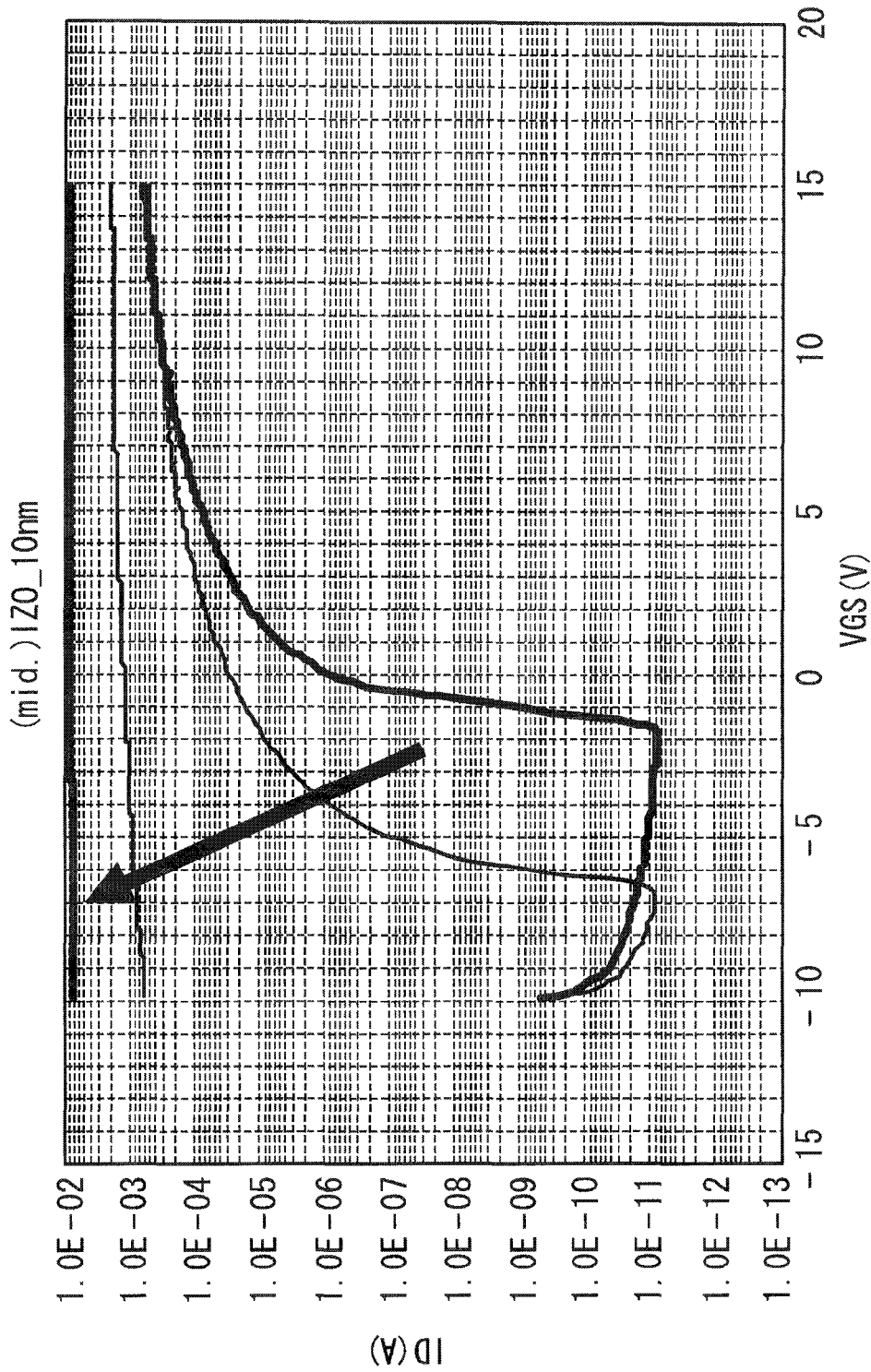
FIG. 15 is a figure showing a variation of a threshold value due to a thermal treatment when the thickness of an active layer is 10 nm.

FIG. 13 shows Vg-Id curves before and after thermal treatment for TFT when the thickness of the active layer is 1.25 nm, FIG. 14 shows Vg-Id curves before and after thermal treatment for TFT when the thickness of the active layer is 2.5 nm, and FIG. 15 shows Vg-Id curves before and after thermal treatment for TFT when the thickness of the active layer is 10 nm. From these figures, it is revealed that the smaller the thickness of the active layer is, the smaller the threshold value shift due to thermal treatment is.

From these experimental results, in the TFT of the present invention, the following is revealed regarding the thickness of the active layer.

A TFT of the present invention sufficiently functions as a switching element or the like because even when the active layer is extremely thin such that the thickness is 1.0 nm or more and less than 2.0 nm, a mobility of at least about 10 cm$^2$/Vs is obtained. When such an extremely thin active layer is formed, a variation of a threshold value is small even when a thermal treatment is applied upon forming an inter-layer dielectric or the like in a process after production of TFT, which is advantageous to production of organic EL device and the like.

Further, as the active layer becomes thinner, electromagnetic waves having a short wavelength such as blue light or X-rays are less likely to be absorbed and the sensitivity of the active layer decreases, and thereby a malfunction of the TFT caused by light can be effectively prevented.

In addition, when an extremely thin active layer is formed as described above, for example, plural active layers may be provided in a laminated structure to improve the mobility. Preferably, the active layers are laminated such that an intermediate interface layer comprising an amorphous oxide semiconductor containing Ga or Al is interposed between the active layers adjacent to each other, in which the content of Ga or Al in the amorphous oxide semiconductor of the intermediate interface layer is higher than the content of Ga or Al in the amorphous oxide semiconductor of the active layers, as in the case of the first interface layer or the second interface layer. For example, although an active layer which is rich in In (IZO or In$_2$O$_3$) is lacking in heat resistance, when each of extremely thin active layers which is rich in In is laminated so that it is interposed between oxide semiconductor layers which have a high content of Ga (for example, IGZO), a variation of a threshold value due to thermal treatment at post-process is suppressed, as well as malfunctions of the TFT due to blue light or X-rays are inhibited, and a TFT having a higher mobility (an ON current being high) can be obtained.

When the active layers are laminated while providing the intermediate interface layers as described above, a thickness of the intermediate interface layer is preferably from 0.5 nm to 3.0 nm, and the number of laminated active layers is preferably 3 or less, from the viewpoints of increasing in mobility, suppressing malfunction of the TFT due to blue light or X-rays, and the like.

On the other hand, in the case that the thickness of the active layer is within a range of 2.5 nm to 15 nm, as compared with the case where the thickness is less than 2 nm, a variation of a threshold value due to thermal treatment is easy to occur and malfunction is easy to occur because sensitivity with respect to blue light or X-rays is high. On the contrary, in this case, mobility is large and threshold value shift due to current stress is small, so that it is possible to drive stably in a long term. Therefore, even though the thickness of the active layer is in a range of from 2.5 nm to 15 nm, for example, when thermal treatment with a high temperature (for example 120° C. or higher) is not performed in the post-process, and a protective layer or the like which protects the TFT from light that is liable to cause malfunction such as blue light or the like is separately provided, it is possible to obtain a TFT which drives more stably.

A thickness of the first interface layer is preferably 0.3 nm or more and less than 1.0 nm, more preferably from 0.4 nm to 0.9 nm, and even more preferably from 0.5 nm to 0.8 nm, from the viewpoint of exhibiting the functions described later.

A thickness of the second interface layer is preferably from 10 nm to 200 nm, more preferably from 15 nm to 100 nm, and even more preferably from 20 nm to 50 nm, from the viewpoint of exhibiting the functions described later.

Further, in a point of view of sufficiently inhibiting a variation of a threshold voltage, it is preferable to fulfill at least one of the following conditions.

Oxygen vacancy densities of the active layer and the first interface layer are substantially the same.

Oxygen vacancy densities of the active layer and the second interface layer are substantially the same.

A specific resistance of the first interface layer is lower than 10$^{10}$ Ωcm.

1) Structure

Next, the structure of the TFT of the invention will be described in detail with reference to the drawings.

FIG. 1 is a schematic diagram showing an example of the inverted-staggered structure of the TFT of the invention. In the case where a substrate 1 is formed of a flexible substrate such as a plastic film or the like, an insulating layer 6 is disposed on one surface of the substrate 1, and a gate electrode 2, a gate insulating layer 3, a first interface layer 61, an active layer 4, and a second interface layer 62 are formed on the insulating layer 6. On the surface of the structure thus constructed, a source electrode 5-1 and a drain electrode 5-2 are disposed.

The active layer includes an amorphous oxide semiconductor containing at least In and Zn. For example, an amorphous oxide semiconductor, such as In—Zn—O type oxide semiconductor described in Applied Physics Letter, vol. 89, 062103 (2006) is used.

The first interface layer and the second interface layer include an amorphous oxide semiconductor which contains Ga or Al at a higher content than the amorphous oxide semiconductor of the active layer.

In a point of view of inhibiting a variation of a threshold voltage, it is preferred that among the active layer, the first interface layer and the second interface layer, the first interface layer is the thinnest and the second interface layer is the thickest.

According to the structure of the embodiment of the invention, since the first interface layer prevents the active layer from directly contacting the gate insulating layer, a variation in oxygen vacancy density of the active layer due to the influence of the gate insulating layer is inhibited. Preferably, the first interface layer substantially does not contribute to carrier transport when voltage is applied to the gate electrode, and therefore, a thickness of the first interface layer is thinner than that of the active layer so that sufficient current cannot flow only by means of the first interface layer. When a composition of the amorphous oxide semiconductor of the active layer has a high hole mobility and the thickness of the active layer is sufficiently large, a high electric field effect mobility can be obtained. As a result of this structure, in addition to obtaining the high electric field effect mobility, a variation of a threshold value within a substrate is decreased, and a threshold voltage is shifted toward the positive side. Although the mechanism thereof is not clear, it is assumed that the first interface layer which contains Ga or Al, the content of Ga or Al in the amorphous oxide semiconductor of the first interface layer being higher than the content of Ga or Al in the amorphous oxide semiconductor of the active layer, may form a stable and deep energy level at an interface with the gate insulating layer, and the threshold voltage is determined by the deep interface level.

The second interface layer is formed of an amorphous oxide semiconductor which contains Ga or Al, the content of Ga or Al in the amorphous oxide semiconductor of the second interface layer being higher than the content of Ga or Al in the amorphous oxide semiconductor of the active layer. The second interface layer protects the active layer from external stresses, such as heat or ultraviolet rays in processes after formation of the active layer or after production of the TFT, and thereby, unfavorable changes in electrical characteristics or degradation of storage stability may be prevented.

By forming a second interface layer which is thicker than the active layer, the effect of the second interface layer can be increased.

FIG. 2 is a schematic diagram showing another example of the inverted-staggered structure of the TFT of the invention.

On one surface of a plastic film substrate 21, an insulating layer 26 is disposed, and on the insulating layer 26, a gate electrode 22, a gate insulating layer 23, an intermediate layer 7, a source electrode 5-21 and a drain electrode 5-22 are disposed. Thereafter, a first interface layer 261, an active layer 24, and a second interface layer 262 are formed in layers. As materials which constitute these layers, materials similar to those in the structure shown in FIG. 1 are used. The intermediate layer 7 is a layer formed of an inorganic oxide such as SiO₂ or the like.

Figure 3:
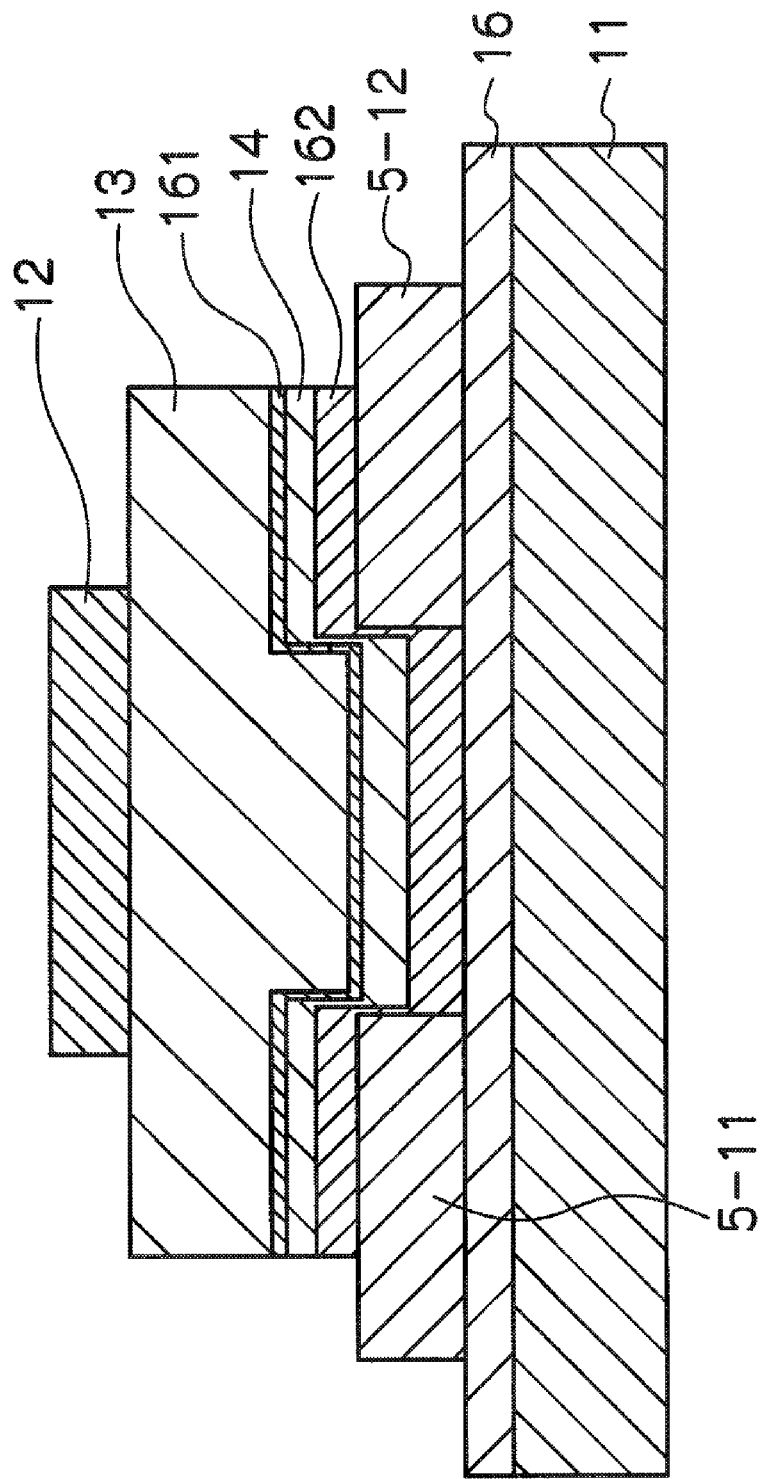
FIG. 3 is a schematic diagram showing a structure of a TFT element having a top gate structure according to the invention.

FIG. 3 is a schematic diagram showing an example of the top gate structure of the TFT of the invention. In the case where a substrate is formed of a flexible substrate such as a plastic film or the like, an insulating layer 16 is disposed on one surface of the substrate 11, and on the insulating layer, a source electrode 5-11 and a drain electrode 5-12 are disposed. Thereon, a second interface layer 162, an active layer 14, and a first interface layer 161 are formed, and thereafter, a gate insulating layer 13 and a gate electrode 12 are formed. The TFT having a top gate structure according to the embodiment of the invention also exhibits effects similar to those of an inverted-staggered structure.

2) Electric Conductivity

The electric conductivity of the active layer in the invention is to be explained.

The electric conductivity is a physical property which indicates how much electricity a substance can conduct. When the carrier concentration of a substance is denoted by n, an electric elementary quantity is denoted by e, and the carrier mobility is denoted by $\mu$, the electric conductivity $\sigma$ of the substance is expressed as follows.

$$\sigma = ne\mu$$

When the active layer is formed of an n-type semiconductor, the carrier is an electron. In this case, the carrier concentration refers to the concentration of electron carriers, and the carrier mobility refers to the electron mobility. Conversely, when the active layer is a p-type semiconductor, the carrier is a hole. In this case, the carrier concentration refers to the concentration of hole carriers, and the carrier mobility refers to the hole mobility. Further, the carrier concentration and carrier mobility of a substance can be determined by Hall measurements.

<Method of Determining Electric Conductivity>

The electric conductivity of a film can be determined by measuring the sheet resistance of the film, provided that the thickness of the film is known. The electric conductivity of a semiconductor changes depending on the temperature, and the electric conductivity cited herein refers to the electric conductivity at room temperature (20° C.).

3) Gate Insulating Layer

For the gate insulating layer, an insulator such as $SiO_2$, $SiN_x$, $SiON$, $Al_2O_3$, $Y_2O_3$, $Ta_2O_5$, $HfO_2$ or the like, or a mixed crystal compound containing at least two of them is used. Also, a polymeric insulator such as polyimide may be used for the gate insulating layer.

It is preferable that the gate insulating layer has a thickness of from 10 nm to 10 μm. To reduce the leak current and raise the voltage resistance, it is required to make the gate insulating layer thicker to a certain extent. However, an increase in the thickness of the gate insulating layer results in a rise in the voltage needed for driving the TFT. Therefore, it is preferable that the thickness of the gate insulating layer is from 50 nm to 1000 nm for an inorganic insulator, and from 0.5 μm to 5 μm for a polymeric insulator. Especially, it is particularly preferable to use an insulator with a high dielectric constant, such as $HfO_2$, for the gate insulating layer, because then the TFT can be driven with low voltage even when it is made thicker.

4) Active Layer

For the active layer according to the invention, an amorphous oxide semiconductor which contains at least In and Zn is used. Since the amorphous oxide semiconductor film can be formed at a low temperature, it can be formed on a flexible resin substrate made of such as plastic. As the amorphous oxide semiconductor which is preferable in the invention, oxides containing In and Zn, as disclosed in Applied Physics Letters, vol. 89, 062103 (2006), can be used. In addition to In and Zn, Ga or Al may be contained.

Specifically, the amorphous oxide semiconductor according to the invention preferably has a constitution including In—O or a constitution including In—Ga—Zn—O (abbreviated as IGZO) in a crystalline structure. An amorphous oxide semiconductor of such a composition has a feature that electron mobility tends to increase with an increase in electric conductivity. In addition, the electric conductivity can be controlled by controlling the partial pressure of oxygen during film formation, as described in JP-A No. 2006-165529.

<Electric Conductivity of Active Layer>

The electric conductivity of the active layer in the invention is preferably $10^{-4}$ Scm$^{-1}$ or more and less than $10^2$ Scm$^{-1}$, and more preferably $10^{-1}$ Scm$^{-1}$ or more and less than $10^2$ Scm$^{-1}$.

<Oxygen Vacancy Densities of Active Layer and Interface Layer>

The oxygen vacancy density of the active layer and the oxygen vacancy density of the first interface layer are preferably substantially the same. More preferably, in addition, the oxygen vacancy density of the active layer and the oxygen vacancy density of the second interface layer are substantially the same.

A carrier concentration determined by Hall Effect measurement is indicated by an oxygen vacancy density. Therefore, the oxygen vacancy density is determined by the carrier concentration measurement by Hall Effect measurement.

—Measurement of Carrier Concentration by Hall Effect Measurement Method—

The carrier concentration of the sample for measurement of physical properties is determined by Hall Effect measurement using a ResiTest 8300 (manufactured by Toyo Corporation). The Hall Effect measurement is executed under an environment of 20° C. For measurement of film thickness of the sample for measurement of physical properties, a contact stylus-type surface profiler Dektak-6M (manufactured by ULVAC, Inc.) is used. The thickness of the sample for measurement may be 100 nm, which is formed in a similar condition to that in the formation of the active layer. Al is used as an electrode for the measurement.

5) First Interface Layer and Second Interface Layer

The first interface layer and the second interface layer of the invention comprise an amorphous oxide semiconductor which contains Ga or Al at a higher content than the amorphous oxide semiconductor of the active layer. As the amorphous oxide semiconductor preferable in the invention, an oxide containing In, Ga, and Zn as disclosed in JP-A No. 2006-165529 may be used.

An amorphous oxide semiconductor which contains In—Ga—Zn—O and whose composition in a crystalline state is represented by $InGaO_3(ZnO)_m$ (m is a natural number lower than 6) is preferable. $InGaZnO_4$ is particularly preferable.

An amorphous oxide containing Al or the like is also preferably used. For example, an amorphous oxide semiconductor containing Al with In and Zn is preferable.

In the invention, electric conductivities of the first interface layer and the second interface layer are not particularly limited, and may be equal to or less than the electric conductivity of the active layer.

<Control Means for Electric Conductivity>

In the case that an active layer is formed of an amorphous oxide semiconductor, an electric conductivity of the active layer in the invention is controlled by the following means. Similarly, electric conductivities of the first interface layer and the second interface layer are controlled by the following means.

(1) Adjustment by Oxygen Defect

It is known that when an oxygen vacancy is caused in an oxide semiconductor, carrier electrons are generated, which results in an increase in electric conductivity. Hence, the electric conductivity of an oxide semiconductor can be controlled by adjusting the quantity of oxygen vacancies. Specifically, examples of methods for controlling the quantity of oxygen vacancies include adjusting the partial pressure of oxygen during film formation, and oxygen concentration and treatment time of an after-treatment after the film formation. Specifically, examples of the after-treatment include thermal treatment at a temperature of 100° C. or higher, processing by oxygen plasma, and UV ozone treatment. Among these, the method involving controlling the partial pressure of oxygen during film formation is preferable in view of its productivity. It is disclosed in JP-A No. 2006-165529 that the electric conductivity of an oxide semiconductor can be controlled by adjusting the partial pressure of oxygen during film formation. In the invention, this means may be preferably used.

(2) Adjustment by Composition Ratio

It has been known that the electric conductivity can be changed by changing the composition ratio of metals of an oxide semiconductor. For instance, it is disclosed in JP-A No. 2006-165529 that in the case of $InGaZn_{1-x}Mg_xO_4$, the electric conductivity lowers with an increase in the percentage of Mg. In addition, it has been reported that the electric conductivity of oxides of $(In_2O_3)_{1-x}(ZnO)_x$ lowers with an increase in the percentage of Zn when the Zn/In ratio is 10% or higher ("Developments of Transparent Conductive Films II", CMC Publishing Co., Ltd, pages 34-35). Specifically, examples of methods for changing the composition ratio, for example in the case of a method of forming a film by sputtering, include a method using targets with different composition ratios. Alternatively, multiple targets may be co-sputtered and the composition ratio of the resultant film can be changed by individually adjusting the sputtering rates for the targets.

(3) Adjustment by Impurities

It is disclosed in JP-A No. 2006-165529 that, when elements such as La, Na, Mn, Ni, Pd, Cu, Cd, C, N, or P are selectively added to an oxide semiconductor as an impurity, the electron carrier concentration can be reduced, that is, electric conductivity can be lowered. Examples of methods for adding an impurity include a method by co-deposition of the oxide semiconductor and the impurity, a method for adding an impurity to an oxide semiconductor film, which has already been formed, by ion-doping with ions of the impurity element, and the like.

(4) Adjustment by Oxide Semiconductor Material

While the methods of adjusting the electric conductivity of the same oxide semiconductor system have been described in the above (1) to (3), as a matter of course, the electric conductivity can be changed by changing the oxide semiconductor material. It is known that the electric conductivity of $SnO_2$-based oxide semiconductors is lower than the electric conductivity of $In_2O_3$-based oxide semiconductors. In this way, the electric conductivity can be adjusted by changing the oxide semiconductor material. In particular, as the oxide materials having a low electric conductivity, oxide insulator materials such as $Al_2O_3$, $Ga_2O_3$, $ZrO_2$, $Y_2O_3$, $Ta_2O_3$, MgO, $HfO_3$, and the like are known, and it is possible to use these materials.

As the means for adjusting the electric conductivity, the methods stated in the above (1) to (4) may be used independently or in combination.

<Method of Forming Active Layer>

As the methods for forming a film of the active layer, it is suitable to adopt a vapor-phase film forming method using, as a target, a polycrystalline sintered body of an oxide semiconductor. Among the vapor-phase film forming methods, sputtering method and pulsed laser deposition method (PLD method) are adequate. For mass production, sputtering method is preferable.

For instance, by an RF magnetron sputtering deposition method, a film can be formed while controlling the degree of vacuum and flow rate of oxygen. The higher the flow rate of oxygen is, the lower the electric conductivity can be made.

Similarly, formation of the first interface layer and the second interface layer may be conducted by the methods described above.

It can be verified by conventional X-ray diffraction that the resultant film is an amorphous film. The thickness of the film can be determined by contact stylus-type surface profile measurement. The composition ratio can be determined by RBS (Rutherford Backscattering Spectrometry) analysis.

6) Gate Electrode

According to the invention, the following materials are preferable for the gate electrode: for example, a metal such as Al, Mo, Cr, Ta, Ti, Au, Ag or the like; an alloy such as Al—Nd, APC or the like; a metal oxide electrically conductive film of tin oxide, zinc oxide, indium oxide, indium-tin oxide (ITO), indium-zinc oxide (IZO) or the like; an organic electrically conductive compound such as polyaniline, polythiophene, polypyrrole or the like; and a mixture thereof.

The thickness of the gate electrode is preferably from 10 nm to 1000 nm.

The method of forming the gate electrode is not particularly limited. The gate electrode can be formed on the substrate according to a method which is appropriately selected from among wet methods such as a printing method, a coating method or the like; physical methods such as a vacuum deposition method, a sputtering method, an ion plating method or the like; chemical methods such as a chemical vapor deposition (CVD), plasma CVD method or the like; and the like in consideration of the suitability to the material described above. For example, when ITO is selected, the gate electrode can be formed according to a direct current or high-frequency sputtering method, a vacuum deposition method, an ion plating method or the like. Further, in the case where an organic electrically conductive compound is selected as the material of the gate electrode, the film formation of the gate electrode can be performed according to a wet film-forming method.

7) Source Electrode and Drain Electrode

Examples of materials suitable for the source electrode and the drain electrode in the invention include metals such as Al, Mo, Cr, Ta, Ti, Au, Ag or the like; alloys such as Al—Nd, APC or the like; metal oxide electrically conductive films of, for example, tin oxide, zinc oxide, indium oxide, indium-tin oxide (ITO), indium-zinc oxide (IZO) or the like; organic electrically conductive compounds such as polyaniline, polythiophene, polypyrrole or the like; and mixtures thereof.

The thickness of the source electrode and the thickness of the drain electrode are each preferably from 10 nm to 1000 nm.

The method of forming the source electrode and drain electrode is not particularly limited. The electrodes can be formed on the substrate according to a method which is appropriately selected from among wet methods such as a printing method, a coating method or the like; physical methods such as a vacuum deposition method, a sputtering method, an ion plating method or the like; chemical methods such as a CVD, a plasma CVD method or the like; and the like in consideration of the suitability to the material described above. For example, when ITO is selected, a film thereof can be formed according to a direct current or high-frequency sputtering method, a vacuum deposition method, an ion plating method or the like. Further, in the case where an organic electrically conductive compound is selected as the material of the source electrode and the drain electrode, the film formation of the source electrode and drain electrode can be performed according to a wet film-forming method.

8) Intermediate Layer

In the case of a bottom contact structure in which the active layer is formed after the source and drain electrodes are formed, as shown in FIG. 2, it is preferable to provide a source electrode 5-21 and a drain electrode 5-22 after an intermediate layer 7 is provided on a gate insulating layer 23.

The intermediate layer is a layer for increasing an adhesion strength of the interface between the gate insulating layer and the oxide semiconductor layer. In particular, it is effective when the gate insulating layer is formed of an organic material. The electric characteristics of the interface are stabilized by providing the intermediate layer.

Examples of a material for use in the intermediate layer include metal oxides, such as MgO, SiO, $SiO_2$, $Al_2O_3$, GeO, NiO, CaO, BaO, $Fe_2O_3$, $Y_2O_3$, $TiO_2$ or the like, metal nitrides, such as $SiN_x$, $SiN_xO_y$ or the like, metal fluorides, such as $MgF_2$, LiF, $AlF_3$, $CaF_2$ or the like, and the like. An amorphous $SiO_2$ layer is preferable.

A thickness of the intermediate layer in the invention is preferably from 1 nm to 500 nm, more preferably form 2 nm to 100 nm, and still more preferably form 5 nm to 50 nm.

The method of forming the intermediate layer is not particularly limited. For example, the intermediate layer can be formed by a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, a transfer method or the like.

5) Substrate

The substrate 1 used in the invention is not particularly limited. Examples of materials suitable for the substrate includes inorganic materials such as YSZ (yttria-stabilized zirconia), glass or the like; and organic materials such as synthetic resins including polyesters such as polyethylene terephthalate, polybutylene terephthalate and polyethylene naphthalate, polystyrene, polycarbonate, polyether sulfone, polyarylate, allyl diglycol carbonate, polyimide, polycycloolefin, norbornene resin, and polychlorotrifluoroethylene. In the case of employing one of the organic materials described above, a material superior in heat resistance, stability of dimension, resistance to solvents, electric insulating property, workability, low gas permeability, low hydroscopicity, and the like is preferable for the substrate.

According to the invention, it is particularly preferable to use a flexible substrate. As for the material used for the flexible substrate, an organic plastic film which has high transmittance is preferable. Examples of materials which can be used include polyesters such as polyethylene terephthalate, polybutylene phthalate and polyethylene naphthalate; and plastic films such as of polystyrene, polycarbonate, polyether sulfone, polyarylate, polyimide, polycycloolefin, norbornene resin, or polychlorotrifluoroethylene. Also, it is preferable that the film-shaped plastic substrate has an insulating layer in the case where the insulation of the substrate is insufficient, a gas-barrier layer for preventing moisture and oxygen from penetrating through the substrate, or an undercoat layer for enhancing planarity of the film-shaped plastic substrate and adhesion of the electrode or active layer to the substrate.

It is preferable that the thickness of the flexible substrate is from 50 μm to 500 μm. The reason for this is that when the thickness of the flexible substrate is less than 50 μm, it is difficult for the substrate itself to maintain sufficient planarity, and when the flexible substrate is thicker than 500 μm, it becomes difficult to bend the substrate itself freely, i.e., the flexibility of the substrate becomes insufficient.

10) Protective Insulating Layer

If necessary, a protective insulating layer may be provided on TFT. The protective insulating film is provided to protect a semiconductor layer from deterioration by air, and to insulate a device formed on the TFT from the TFT.

Specific examples of materials for the protective insulating layer include metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$, and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective insulating layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

11) After Treatment

If necessary, thermal treatment may be conducted as an after treatment for the TFT. The thermal treatment is performed under air or nitrogen environment at 100° C. or higher. The thermal treatment may be conducted after forming the semiconductor layer or at the final step of TFT fabrication steps. The thermal treatment has effects that a fluctuation of TFT properties on the substrate is prevented, and drive stability is improved.

(Applications)

The thin film field effect transistor of the invention can be used, for example, in an X-ray imaging apparatus, an image display with a liquid crystal or EL element incorporated therein, and especially it can be used as a switching element or a driving element of an FPD. It is particularly suitable to use the thin film field effect transistor as a switching element or a driving element for a flexible FPD device.

In addition to displays, the thin film field effect transistor of the invention can be applied extensively to e.g., IC cards, ID tags and the like, in which the thin film field effect transistor is formed on a flexible substrate such as an organic plastic film.

EXAMPLES

In the following, the thin film field effect transistor of the present invention will be explained by examples thereof, but the invention is by no means limited by these examples.

Example 1 and Comparative Examples 1 to 4

1. Fabrication of TFT Element

Example 1

Fabrication of TFT Element 1 of the Invention

TFT element 1 of the invention having a configuration shown in FIG. 2 was fabricated as follows.

Substrate 21: a polyethylene naphthalate (PEN) film having a thickness of 125 µm was used.

Insulating layer 26: SiON was deposited to give a thickness of 500 nm by a sputtering deposition method.

Gate electrode 22: a molybdenum layer having a thickness of 40 nm was formed by a sputtering deposition method, which was subjected to photolithography and etching to form a stripe-shaped gate electrode.

Gate insulating layer 23: an acrylic resin was spin-coated, which was sintered to form a gate insulating layer 23 having a thickness of 0.5 µm.

Intermediate layer 7: on the gate insulating layer 23, an intermediate layer 7 having a thickness of 20 nm was provided by performing sputtering deposition of $SiO_2$ through a metal mask at room temperature.

Source electrode 5-21 and drain electrode 5-22: on the whole surface of intermediate layer 7, a layer with a thickness of 200 nm was formed by performing RF sputtering at room temperature using zinc indium oxide (manufactured by Idemitsu Kosan Co., Ltd.) as a target. Then, the resulting layer was processed by photolithography and etching to form a stripe-shaped zinc indium oxide electrode being at right angles to the gate electrode (at this stage, a source electrode and a drain electrode are not separated.). Next, on the stripe-shaped zinc indium oxide electrode, a negative resist was coated, and the resist was cured by exposure from the substrate side, which was then subjected to etching using oxalic acid as an etchant. Thereby, a self-aligned source electrode 5-21 and drain electrode 5-22 were formed with respect to the gate electrode.

First interface layer 261: on the intermediate layer 7, the source electrode 5-21 and the drain electrode 5-22, a first interface layer 261 having a thickness of 0.7 nm was provided by performing oxygen-introduced RF magnetron sputtering using a target having a composition of $InGaZnO_4$ (hereinafter also referred to as "IGZO") through a metal mask at room temperature to form an IGZO film.

Active layer 24: on first interface layer 261, an active layer 24 having a thickness of 10 nm was provided by performing oxygen-introduced RF magnetron sputtering using a target having a composition of $In_3O_2$ including 10% by weight of ZnO (hereinafter also referred to as "IZO") through a metal mask at room temperature to form an IZO film.

Second interface layer 262: on the active layer 24, a second interface layer 262 having a thickness of 40 nm was provided by performing oxygen-introduced RF magnetron sputtering using a target having a composition of IGZO through a metal mask at room temperature to form an IGZO film.

Comparative Example 1

Fabrication of Comparative TFT Element 1

As comparative TFT element 1, an element not having the first interface layer in TFT element 1 of the invention was fabricated. Fabrication of comparative TFT element 1 was conducted in a similar manner to the process in the fabrication of TFT element 1 of the invention, except that, in the fabrication of TFT element 1 of the invention, the step of providing the first interface layer was omitted.

Comparative Example 2

Fabrication of Comparative TFT Element 2

As comparative TFT element 2, an element not having the second interface layer in TFT element 1 of the invention was fabricated. Fabrication of comparative TFT element 2 was conducted in a similar manner to the process in the fabrication of TFT element 1 of the invention, except that, in the fabrication of TFT element 1 of the invention, the step of providing the second interface layer was omitted.

Comparative Example 3

Fabrication of Comparative TFT Element 3

Fabrication of comparative TFT element 3 was conducted in a similar manner to the process in the fabrication of TFT element 1 of the invention, except that, in the fabrication of TFT element 1 of the invention, IGZO was used in place of IZO for the active layer.

Comparative Example 4

Fabrication of Comparative TFT Element 4

Fabrication of comparative TFT element 4 was conducted in a similar manner to the process in the fabrication of TFT element 1 of the invention, except that, in the fabrication of TFT element 1 of the invention, the first interface layer and the second interface layer were not provided.

2. Performance Evaluation

For each of the obtained TFT element 1 of the invention and comparative TFT elements 1 to 4, the following evaluation was performed.

1) Evaluation Method

<Measurement of Electric Field Effect Mobility>

Figure 4:
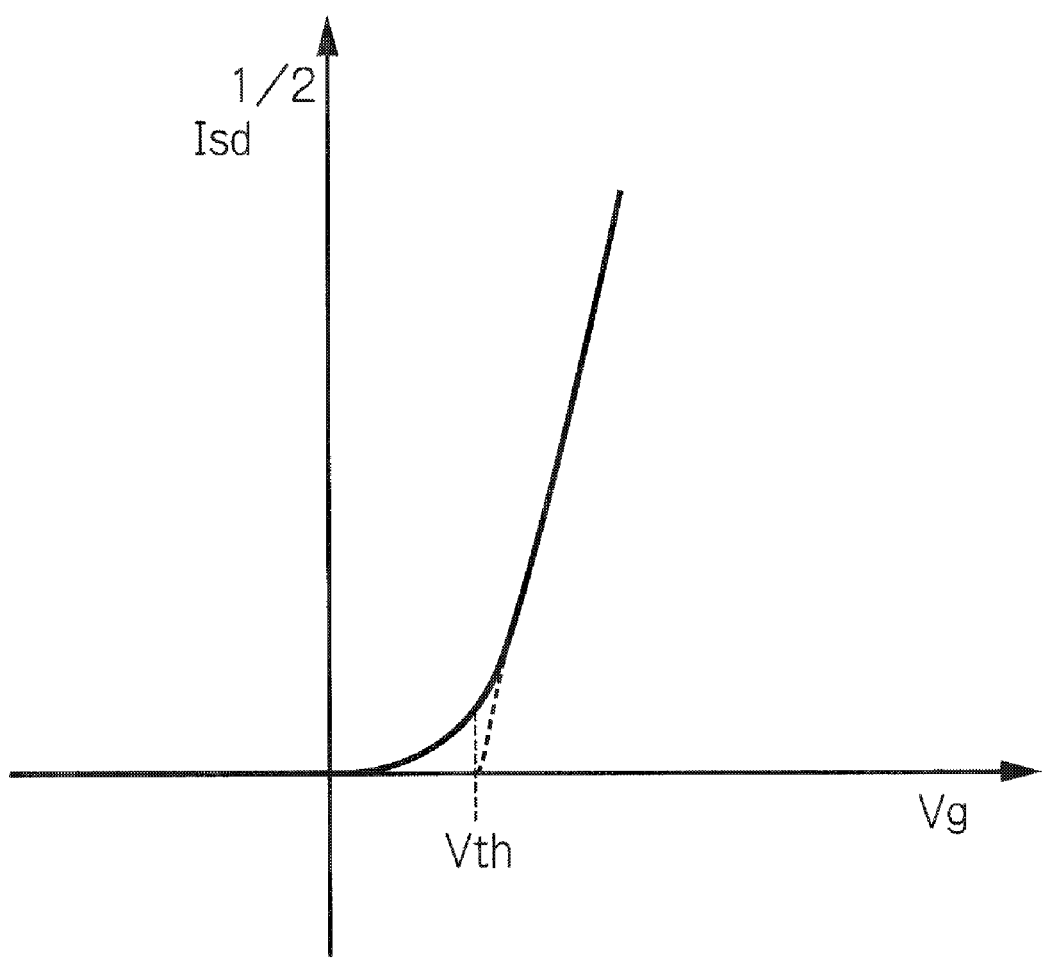
FIG. 4 is a schematic view of a graph showing how to determine a threshold voltage (Vth) of a TFT in the evaluation of performance. The horizontal axis represents a gate voltage ($V_{GS}$), and the vertical axis represents a square root of $I_{DS}$ (current between a source electrode and a drain electrode) ($I_{DS}^{1/2}$).

As schematically shown in FIG. 4, a current between the drain electrode and the source electrode ($I_{DS}$) is considered as a function of voltage between the gate electrode and the source electrode ($V_{GS}$), a graph is prepared, and threshold voltage ($V_{th}$) is obtained from the graph. In this case, the voltage between the drain electrode and the source electrode ($V_{DS}$) is fixed to 10 V, and $V_{GS}$ is changed from −10 V to +15 V. From a curve of $(I_{DS})^{1/2}$ vs. $V_{GS}$, the threshold voltage and electric field effect mobility are obtained according to the following equation.

$$I_{DS} = \mu_{FE} \cdot C_{dielectric} \cdot (W/2L) \cdot (V_{GS} - V_{th})^2$$

In the equation, $\mu_{FE}$ represents electric field effect mobility, $V_{th}$ represents threshold voltage, W represents the channel width, L represents the channel length, and $C_{dielectric}$ represents dielectric capacity of the gate insulating layer (including the intermediate layer).

<Threshold Value Variation>

The measurement of electric field effect mobility described above is conducted with respect to nine TFT elements in an area of 25 mm², and a variation of a threshold voltage (standard deviation value: σ) is determined as threshold value variation.

<Storage Stability>

Concerning each of the obtained TFT element 1 of the invention and comparative TFT elements 1 to 4, the above measurement is conducted after storing the elements in a dark room at ordinary temperature and ordinary humidity (at about 25° C. and about 50% RH) for one month after the production thereof and three months after the production thereof, respectively, and the change of the threshold voltage is measured.

2) Evaluation Results

TFT element 1 of the invention exhibits a high electric field effect mobility of 50 cm²/Vs. Comparative TFT element 1 exhibits an electric field effect mobility of 50 cm²/Vs, and comparative TFT element 2 exhibits 50 cm²/Vs, whereas comparative TFT element 3 exhibits a low electric field effect mobility of 10 cm²/Vs. Comparative TFT element 4 exhibits 50 cm²/Vs.

TFT element 1 of the invention shows a threshold variation of σ=±0.1 V, which is preferable. Comparative TFT element 1 shows a threshold variation of σ=±0.1 V, comparative TFT element 2 shows σ=±0.1 V, and comparative TFT element 3 shows σ=±0.1 V, whereas comparative TFT element 4 shows σ=±1.1 V.

Concerning TFT element 1 of the invention, no change in threshold voltage is seen between the storage for one month and storage for three months. Whereas, comparative TFT element 1 has changed by −0.6 V in threshold voltage between the storage for one month and storage for three months, comparative TFT element 2 has changed by −0.6 V, comparative TFT element 3 has not changed, and comparative TFT element 4 has changed by −5.0 V.

As mentioned above, it is revealed that TFT element 1 of the invention has a high electric field effect mobility, exhibits a small variation of a threshold voltage when the TFT is continuously driven, and is excellent in storage stability.

Examples 2 to 5 and Comparative Example 5

1. Fabrication of TFT Element

Example 2

Fabrication of TFT Element 2 of the Invention

TFT element 2 of the invention having a configuration as shown in FIG. 1 was fabricated as follows.

Substrate 1: non-alkali glass having a thickness of 700 μm was used.

Gate electrode 2: a molybdenum layer having a thickness of 40 nm was formed by a sputtering deposition method, which was subjected to photolithography and etching to form a stripe-shaped gate electrode.

Gate insulating layer 3: $SiO_2$ was formed by a sputtering deposition method at room temperature, thereby forming a gate insulating layer having a thickness of 200 nm.

First interface layer 61: on the gate insulating layer, a first interface layer having a thickness of 2.5 nm was provided by performing oxygen-introduced RF magnetron sputtering using a target having a composition of $InGaZnO_4$ (hereinafter also referred to as "IGZO") through a metal mask at room temperature to form an IGZO film.

Semiconductor layer (active layer) 4: on the first interface layer, a semiconductor layer having a thickness of 1.25 nm was provided by performing oxygen-introduced RF magnetron sputtering using a target having a composition of $In_3O_2$ including 10% by weight of ZnO (hereinafter also referred to as "IZO") through a metal mask at room temperature to form an IZO film.

Second interface layer 62: on the semiconductor layer, a cap layer (second interface layer) having a thickness of 10 nm was provided by performing oxygen-introduced RF magnetron sputtering using a target having a composition of $InGaZnO_4$ (hereinafter also referred to as "IGZO") through a metal mask at room temperature to form an IGZO film.

Source electrode 5-1 and drain electrode 5-2: on the second interface layer, aluminum metal (Al) was deposited by performing resistance heating deposition through a metal mask at room temperature, thereby forming source electrode 5-1 and drain electrode 5-2 each having a thickness of 200 nm.

Example 3

Fabrication of TFT Element 3 of the Invention

In a similar manner to that in Example 2, a gate electrode, a gate insulating layer, and a first interface layer were successively formed on a non-alkali glass substrate.

First semiconductor layer: on the first interface layer, a first semiconductor layer having a thickness of 1.25 nm was provided by performing oxygen-introduced DC magnetron sputtering using a target having a composition of $In_3O_2$ including 10% by weight of ZnO (hereinafter also referred to as "IZO") through a metal mask at room temperature to form an IZO film.

Intermediate interface layer: on the first semiconductor layer, an intermediate interface layer having a thickness of 2.5 nm was provided by performing oxygen-introduced RF magnetron sputtering using a target having a composition of IGZO through a metal mask at room temperature to form an IGZO film.

Second semiconductor layer: on the intermediate interface layer, a second semiconductor layer having a thickness of 1.25 nm was provided by performing oxygen-introduced DC magnetron sputtering using a target having a composition of $In_3O_2$ including 10% by weight of ZnO (hereinafter also referred to as "IZO") through a metal mask at room temperature to form an IZO film.

Second interface layer: on the second semiconductor layer, a cap layer (second interface layer) having a thickness of 10 nm was provided by performing oxygen-introduced RF magnetron sputtering using a target having a composition of IGZO through a metal mask at room temperature to form an IGZO film.

A source electrode and a drain electrode were formed in a similar manner to that in Example 2.

Comparative Example 5

Fabrication of Comparative TFT Element 5

A TFT element was fabricated in a similar manner to that in Example 2, except that a semiconductor layer was not formed.

Example 4

Fabrication of TFT Element 4 of the Invention

A TFT element was fabricated in a similar manner to that in Example 2, except that the thickness of the semiconductor layer was changed to 2.5 nm.

Example 5

Fabrication of TFT Element 5 of the Invention

A TFT element was fabricated in a similar manner to that in Example 2, except that the thickness of the semiconductor layer was changed to 1.9 nm.

2. Performance Evaluation

For each of the obtained TFT elements 2 to 5 of the invention and comparative TFT element 5, the following evaluation was performed.

1) Evaluation Method

<Measurement of Threshold Voltage and Electric Field Effect Mobility>

For each of TFT element, the threshold voltage and electric field effect mobility are obtained according to the following equation explained above.

$$I_{DS} = \mu_{FE} \cdot C_{dielectric} \cdot (W/2L) \cdot (V_{GS} - V_{th})^2$$

<Temperature Dependency of TFT>

As post-annealing, each TFT element is subjected to thermal treatment at 180° C., for one hour, under an atmosphere of $O_2$, and threshold voltage after the thermal treatment is measured.

2) Evaluation Results

TFT element of comparative example 5 exhibits an electric field effect mobility of 1 cm²/Vs, whereas TFT elements of examples 2, 3, and 4 exhibit a high electric field effect mobility of 10 cm²/Vs, 14 cm²/Vs, and 14 cm²/Vs, respectively. TFT element of example 5 exhibits 12 cm²/Vs.

In TFT element of example 4, Vth has changed to a negative value by conducting post-annealing, whereas Vths have not changed in TFT elements of examples 2, 3, and 5.

Figure 16:
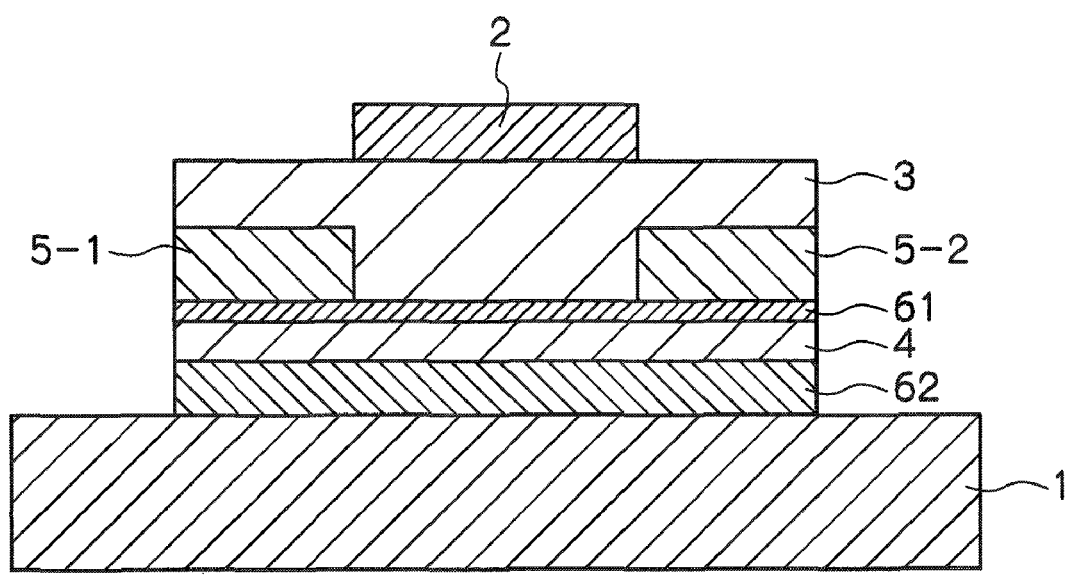
FIG. 16 is a schematic diagram showing a structure of a TFT element having a top gate structure according to another embodiment of the invention.

In the above description, the present invention is explained, but the present invention is not limited to the above exemplary embodiments and examples. For example, in FIG. 1, a TFT having an inverted-staggered and top contact structure, in FIG. 2, a TFT having an inverted-staggered and bottom contact structure, and in FIG. 3, a TFT having a staggered and bottom contact structure are shown as examples, but the invention is not limited to these structures. As shown in FIG. 16, an embodiment in which a second interface layer 62, an active layer 4, and a first interface layer 61 are successively formed on substrate 1, followed by forming source and drain electrodes 5-1 and 5-2, a gate insulating layer 3, and a gate electrode 2 successively, that is, a TFT having a staggered and top contact structure, may be applied to the present invention.

All publications, patent applications, and technical standards mentioned in this specification are herein incorporated by reference to the same extent as if each individual publication, patent application, or technical standard was specifically and individually indicated to be incorporated by reference.

What is claimed is:

1. A thin film field effect transistor comprising: at least a gate electrode, a gate insulating layer, an active layer, a source electrode and a drain electrode on a substrate, wherein
    the active layer comprises an amorphous oxide semiconductor containing at least In and Zn;
    a plurality of the active layers are provided, and an intermediate interface layer is disposed between active layers which are adjacent to each other, the intermediate interface layer comprising an amorphous oxide semiconductor containing Ga or Al, and a content of Ga or Al in the amorphous oxide semiconductor of the intermediate layer being higher than the content of Ga or Al in the amorphous oxide semiconductor of the plurality of active layers;
    a first interface layer comprising an amorphous oxide semiconductor containing Ga or Al is disposed between the gate insulating layer and the active layer such that the first interface layer is adjacent to at least the active layer, a content of Ga or Al in the amorphous oxide semiconductor of the first interface layer being higher than a content of Ga or Al in the amorphous oxide semiconductor of the active layer; and
    a second interface layer comprising an amorphous oxide semiconductor containing Ga or Al is disposed on the opposite side of the active layer with respect to the first interface layer such that the second interface layer is adjacent to the active layer, a content of Ga or Al in the amorphous oxide semiconductor of the second interface layer being higher than the content of Ga or Al in the amorphous oxide semiconductor of the active layer.

2. The thin film field effect transistor according to claim 1, wherein the amorphous oxide semiconductor of the active layer comprises In at a content of 70% or more and Zn at a content of 5% or more with respect to all metal components in the amorphous oxide semiconductor of the active layer.

3. The thin film field effect transistor according to claim 1, wherein the content of Ga or Al in the amorphous oxide semiconductor of the first interface layer is at least twice the content of Ga or Al in the amorphous oxide semiconductor of the active layer, and the content of Ga or Al in the amorphous oxide semiconductor of the second interface layer is at least twice the content of Ga or Al in the amorphous oxide semiconductor of the active layer.

4. The thin film field effect transistor according to claim 1, wherein the amorphous oxide semiconductor of the active layer contains In at a content of 70% or more and Zn at a content of 5% or more with respect to all the metal components in the amorphous oxide semiconductor of the active layer, the content of Ga or Al in the amorphous oxide semiconductor of the first interface layer is at least twice the content of Ga or Al in the amorphous oxide semiconductor of the active layer, and the content of Ga or Al in the amorphous oxide semiconductor of the second interface layer is at least twice the content of Ga or Al in the amorphous oxide semiconductor of the active layer.

5. The thin film field effect transistor according to claim 1, wherein a thickness of the active layer is 1.0 nm or more and less than 20 nm.

6. The thin film field effect transistor according to claim 5, wherein the thickness of the active layer is 2.5 nm or more and less than 15 nm.

7. The thin film field effect transistor according to claim 5, wherein the thickness of the active layer is 1.0 nm or more and less than 2.0 nm.

8. The thin film field effect transistor according to claim 1, wherein a thickness of the first interface layer is 0.3 nm or more and less than 1.0 nm.

9. The thin film field effect transistor according to claim 1, wherein a thickness of the second interface layer is from 10 nm to 200 nm.

10. The thin film field effect transistor according to claim 1, wherein a thickness of the active layer is 1.0 nm or more and less than 20 nm, a thickness of the first interface layer is 0.3 nm or more and less than 1.0 nm, and a thickness of the second interface layer is from 10 nm to 200 nm.

11. The thin film field effect transistor according to claim 1, wherein oxygen vacancy densities of the active layer and the first interface layer are substantially the same.

12. The thin film field effect transistor according to claim 1, wherein oxygen vacancy densities of the active layer and the second interface layer are substantially the same.

* * * * *